United States Patent
Gong et al.

(10) Patent No.: US 12,040,291 B2
(45) Date of Patent: Jul. 16, 2024

(54) RADIO FREQUENCY PACKAGES CONTAINING MULTILEVEL POWER SUBSTRATES AND ASSOCIATED FABRICATION METHODS

(71) Applicant: NXP USA, Inc., Austin, TX (US)

(72) Inventors: Zhiwei Gong, Chandler, AZ (US); Li Li, Scottsdale, AZ (US); Lu Li, Gilbert, AZ (US); Lakshminarayan Viswanathan, Phoenix, AZ (US); Fernando A. Santos, Chandler, AZ (US); Burton Jesse Carpenter, Austin, TX (US)

(73) Assignee: NXP USA, Inc., Austin, TX (US)

( * ) Notice: Subject to any disclaimer, the term of this patent is extended or adjusted under 35 U.S.C. 154(b) by 209 days.

(21) Appl. No.: 17/555,861

(22) Filed: Dec. 20, 2021

(65) Prior Publication Data

US 2023/0197645 A1 Jun. 22, 2023

(51) Int. Cl.
*H01L 23/66* (2006.01)
*H01L 21/48* (2006.01)
*H01L 23/498* (2006.01)
*H01L 23/00* (2006.01)

(52) U.S. Cl.
CPC .......... *H01L 23/66* (2013.01); *H01L 21/4857* (2013.01); *H01L 23/49822* (2013.01); *H01L 24/32* (2013.01); *H01L 24/48* (2013.01); *H01L 24/96* (2013.01); *H01L 24/97* (2013.01); *H01L 2223/6605* (2013.01); *H01L 2224/32225* (2013.01); *H01L 2224/48225* (2013.01)

(58) Field of Classification Search
CPC ............. H01L 23/66; H01L 21/4857; H01L 23/49822; H01L 24/32; H01L 24/48; H01L 24/96; H01L 24/97; H01L 2223/6605; H01L 2224/32225; H01L 2224/48225; H01L 23/3121; H01L 2221/68345; H01L 21/561; H01L 21/6835; H01L 23/49861; H01L 23/50; H01L 2223/6611; H01L 23/3677
USPC ......................................................... 257/712
See application file for complete search history.

(56) References Cited

U.S. PATENT DOCUMENTS

| | | | |
|---|---|---|---|
| 6,215,321 B1 * | 4/2001 | Nakata | G01R 1/07378 428/209 |
| 7,399,658 B2 | 7/2008 | Shim et al. | |
| 7,790,512 B1 | 9/2010 | Sirinorakul et al. | |

(Continued)

*Primary Examiner* — Vu A Vu

(57) ABSTRACT

Radio frequency (RF) packages containing multilevel power substrates and associated fabrication methods are disclosed. In an embodiment, the method includes producing a multilevel substrate panel by obtaining a base panel level containing prefabricated base structures and having a surface through which metallic surfaces of the prefabricated base structures are exposed. A secondary panel level is formed on the base layer to include patterned metal features embedded in a secondary dielectric body and electrically contacting the exposed metallic surfaces of the prefabricated base structures at a direct plated interface. The presingulated array of multilevel power substrates is separated into singulated multilevel power substrates each including a base substrate level formed from a singulated piece of the base panel level and a secondary substrate level formed from a singulated piece of the secondary substrate level.

20 Claims, 9 Drawing Sheets

(56) References Cited

U.S. PATENT DOCUMENTS

| | | | |
|---|---|---|---|
| 8,836,149 B2* | 9/2014 | Son | H01L 23/49833 |
| | | | 257/784 |
| 8,933,473 B1* | 1/2015 | Dubin | H01L 21/486 |
| | | | 257/79 |
| 8,946,904 B2* | 2/2015 | Railkar | H01L 23/49827 |
| | | | 257/668 |
| 9,331,003 B1 | 5/2016 | Camacho et al. | |
| 9,601,405 B2* | 3/2017 | Thong | H01L 23/3675 |
| 9,799,622 B2* | 10/2017 | Hu | H05K 1/111 |
| 9,899,292 B2* | 2/2018 | Chiu | H01L 23/552 |
| 10,117,340 B2* | 10/2018 | Hsu | H01L 21/4857 |
| 10,264,664 B1* | 4/2019 | Vinciarelli | H05K 3/207 |
| 10,424,535 B2 | 9/2019 | Huang | |
| 10,785,871 B1* | 9/2020 | Vinciarelli | H05K 1/116 |
| 11,125,968 B2* | 9/2021 | Yang | G02B 7/181 |
| 11,160,160 B1 | 10/2021 | Berkel et al. | |
| 11,324,107 B1* | 5/2022 | Vinciarelli | H05K 3/0014 |
| 2007/0017815 A1 | 1/2007 | Wang et al. | |
| 2011/0089529 A1 | 4/2011 | Fowlkes et al. | |
| 2012/0081864 A1 | 4/2012 | Sakurai et al. | |
| 2012/0092218 A1 | 4/2012 | Akasegawa et al. | |
| 2018/0240748 A1 | 8/2018 | Hu et al. | |
| 2020/0035606 A1 | 1/2020 | Bhagavat et al. | |
| 2021/0193518 A1* | 6/2021 | Aleksov | H03H 9/0547 |

* cited by examiner

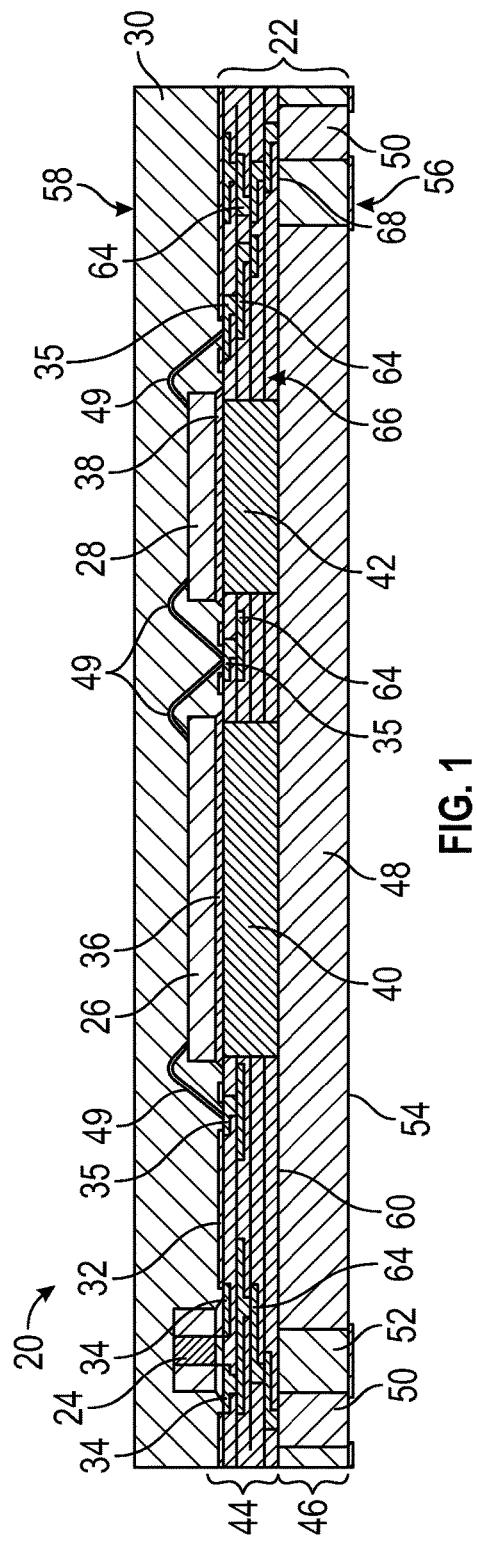
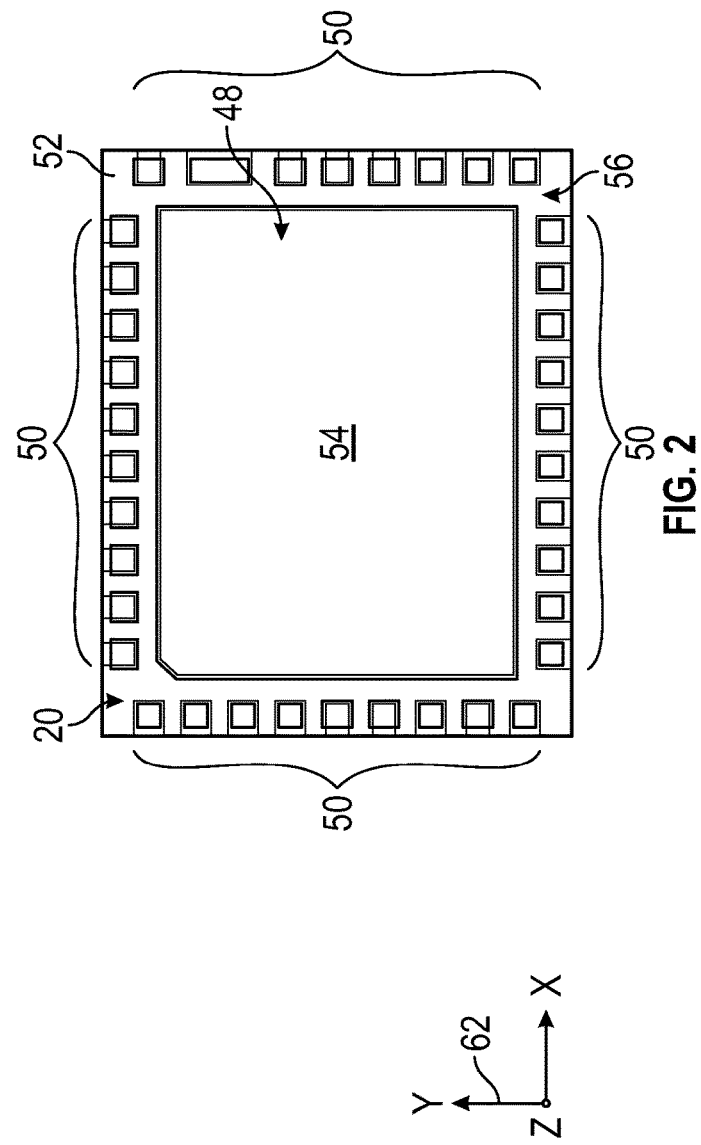

RADIO FREQUENCY PACKAGES CONTAINING MULTILEVEL POWER SUBSTRATES AND ASSOCIATED FABRICATION METHODS

TECHNICAL FIELD

Embodiments of the present disclosure relate generally to microelectronics and, more particularly, to hybrid or multilevel power substrates utilized in radio frequency (RF) packages, as well as to methods for fabricating such multilevel power substrates and RF packages.

BACKGROUND

Radio frequency (RF) packages are presently fabricated utilizing several types of power substrates; that is, substrates allowing electrical connection through a solid metallic or high metal content portion of the substrate to one or more RF power dies within the RF package. The RF power dies may contain transistor-based integrated circuits (ICs), such as field effect transistor (FET) ICs, utilized for RF signal amplification purposes. In one common arrangement, the source terminal of a die-borne FET is electrically coupled to a package ground terminal by mounting the IC die to a metallic region of the power substrate utilizing solder or another electrically-conductive bonding material. The power substrate may assume the form of a metallic (e.g., copper) base flange lacking electrical routing, with the non-populated backside of the base flange exposed from the package exterior to serve as a package ground terminal. In other instances, the power substrate may assume the form of an electrically-routed printed circuit board (PCB), which contains embedded metallic coining or another high metal content structure (e.g., bar or tub vias) to which the packaged IC die or dies are attached. Still other types of RF packages, such as no-lead packages and land grid array packages, are often fabricated utilizing leadframe-based substrates, which include central metallic blocks or die pads to which the packaged IC dies are mounted for heat dissipation and electrical interconnection purposes.

BRIEF DESCRIPTION OF THE DRAWINGS

At least one example of the present invention will hereinafter be described in conjunction with the following figures, wherein like numerals denote like elements, and:

FIGS. 1 and 2 are simplified cross-sectional and bottom planform views, respectively, of a radio frequency (RF) package containing a hybrid or multilevel power substrate, as illustrated in accordance with an example embodiment of the present disclosure;

Figure 3:
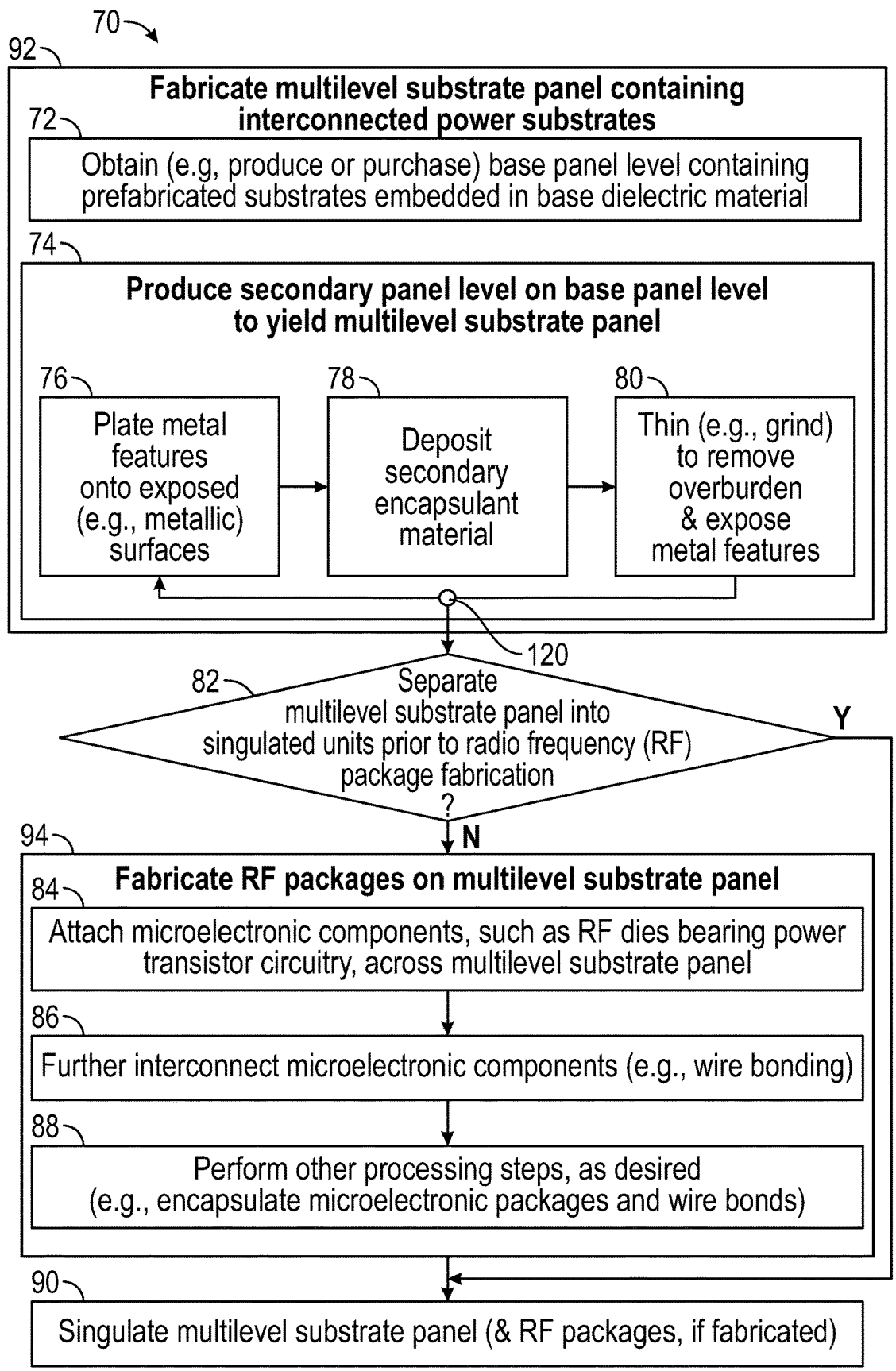
FIG. 3 is a flowchart of a method for fabricating a number of RF packages each containing a multilevel power substrate, which may be similar or identical to RF package and multilevel power substrate shown in FIGS. 1 and 2, respectively, as illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely example in nature and is not intended to limit the invention or the application and uses of the invention As appearing throughout this document, the term "package" encompasses the term "module." By extension, the terms "microelectronic package" and "power amplifier package" encompass the terms "microelectronic module" and "power amplifier module," respectively. Further, the term "panel" broadly encompasses any structure containing multiple interconnected units or articles, regardless of the particular formfactor or planform geometry of the panel. The term "metallic," as further appearing herein, refers to a material principally composed of one or more metals, by weight, and potentially containing lesser amounts of metallic or non-metallic constituents. Similarly, description of a layer, structure, or other feature as composed of a named metal (or metals) indicates that the layer, structure, or other feature is principally composed of the named metal (or metals) by weight. For example, reference to a copper (Cu) layer, structure, or feature indicates that the named layer, structure, or feature is predominately composed of Cu, by weight, but may contain lesser, non-trace amounts of other constituents.

As still further appearing throughout this document, statements indicating that a first layer is "bonded to," "formed over," or "formed on" a second layer (or surface) do not require that the first layer is directly bonded to and intimately contacts the second layer (or surface) unless otherwise expressly stated. Such statements thus do not preclude the possibility that one or more intervening layers may be present between the first layer (or surface) and the second layer (or surface). Further, in this regard, the terms "over" and "on" do not require direct contact between a first layer formed "over" or "on" a second layer (or a surface), unless otherwise accompanied by an express statement to this effect; e.g., a statement indicating that the first layer is formed "directly on" or "in contact with" the second layer (or surface). Further, the terms "over" and "on," as appearing throughout this document, are without restriction as to orientation within a larger three dimensional context. Accordingly, a first layer located beneath a second layer may be described as "formed over" the second layer when the first layer is deposited on, grown on, or otherwise created on the second layer.

Overview

As briefly discussed above, power substrates incorporated into radio frequency (RF) packages often assume the form of printed circuit boards (PCBs) containing embedded metal coins or other high metal content regions, such as localized bar vias, tub vias, or via farms. The coins (or high metal content regions) of the power substrate may provide electrical connection with the RF power die or dies within the RF package, while further supporting relatively efficient conductive extraction and dissipation of excess heat generated by the RF power dies. A PCB-embedded coin, for example, typically assumes the form of a block-shaped Cu slug, which is dimensioned to possess planform dimensions (a width and length) relatively close to the footprint of the RF die attached to the coin. To enhance heat spreading and the overall thermal dissipation capabilities of the power substrate, the planform dimensions of the coin can be maximized to the extent permitted by the pertinent design constraints of the substrate and the larger RF package. However, even when enlarging the PCB-embedded coin to the extent permitted by design constraints, the cumulative thermal resistance of the PCB-based power substrate, which further includes various dielectric layers and metal routing features, often remains undesirably high for usage within high performance RF packages containing IC dies prone to excess heat generation; e.g., power amplifier (PA) packages containing heat-generating RF power dies bearing carrier and peaking transistor ICs utilized within a Doherty amplifier circuit. This, in turn, may limit the overall power capabilities and other performance aspects of the RF package. One manner in which this limitation can be addressed is through the usage of leadframe-based power substrates, which are fabricated to include relatively thick metallic blocks or pads to which the RF power dies are attached. Such leadframe-based substrates are, however, generally incompatible with multilayer, fine pitch electrical routing schemes and are consequently poorly suited for usage in the fabrication of RF packages having high density wiring architectures. Similar limitations are also encountered when fabricating RF packages, such as encapsulated packages and air cavity packages, utilizing a metallic base flange.

An ongoing industrial demand thus persists for the provision of increasingly advanced power substrates, which are suitable for incorporation into PA packages and other high performance RF packages, while overcoming the above-noted limitations. In particular, it is desirable for such power substrates to provide not only efficient heat extraction or dissipation from packaged IC dies (and possibly other heat-generating microelectronic components) contained within a given RF package, but to further support relatively dense electrical routing schemes and/or otherwise impart manufacturers with greater flexibility in designing circuit layouts within microelectronic packages. Embodiments of power substrates providing such benefits are disclosed herein, as are RF packages incorporating such power substrates. Embodiments of the presently-disclosed power substrates, and more broadly RF packages incorporating such substrates, further provide other benefits in addition to supporting relatively dense electrical routing schemes, while optimizing thermal performance aspects of the package. For example, embodiments of the below-described power substrates feature unique, direct plating interfaces between different levels or horizontally-extending sections of the power substrate, with such direct plating interfaces resistant to structural compromise (e.g., separation) to increase the overall structural robustness and reliability of a host RF package during usage and thermal cycling. Additionally, in at least some embodiments, the below-described multilevel power substrates enable the embedment of certain microelectronic components, such as IC dies and surface mount devices (SMDs), into the power substrate itself to support additional densification of circuit layouts, to impart host RF packages with greater capabilities, and to provide other benefits. Finally, methods for fabricating multilevel power substrates utilizing large scale, panel-based manufacturing processes are also disclosed below to allow fabrication of the power substrates, and possibly to further support batch fabrication of host RF packages, in streamlined and cost efficient manners.

As stated above, embodiments of the presently-disclosed power substrates contain at least two distinct regions or horizontally-extending sections, which are disposed in a stacked or vertically-overlapping relationship; the term "vertical," as appearing herein, referring to a direction parallel package height or substrate thickness direction, while the term "horizontal" refers to a direction perpendicular to the vertical direction. The overlying substrate sections are referred to as "levels" and may each incorporate any number of individual layers, features, and materials. Given this unique construction, embodiments of the power substrate are specifically described as a "multilevel power substrate" or "hybrid power substrate," which include a first substrate level (herein, "a base substrate level") and a second, structurally-distinct substrate level (herein, a "secondary substrate level" or a "build-up substrate level"). The base substrate level of the multilevel power substrate contains one or more prefabricated base structures, which may be (although are non-essentially) embedded in a molded thermoset material or another body of dielectric material referred to as a "base dielectric body." The base structures are "prefabricated" in the sense that such structures are fabricated prior to performance of the multilevel power substrate fabrication process, strictly considered, examples of which are further discussed below. In certain instances, the prefabricated base structures may assume of the form of leadframe-provided structures (e.g., a leadframe-based die attach pads and metallic contact or terminal blocks) or electrically-routed interposer structures, such as a discrete PCB blocks. Comparatively, the secondary substrate level is built or compiled over and onto, and therefore intimately contacts and is directly bonded to, the base substrate level in embodiments. The secondary substrate level may contain patterned metal features, which are electroplated or otherwise deposited onto metallic features embedded in the base substrate level and exposed along a primary surface of base substrate level. In certain embodiments, relatively thick plated metal features may be formed, some of which may serve as electrically-active or electrically-inactive heat dissipation structures. In other instances, one or more layers of metal routing features may be produced in combination with accompanying encapsulation and thinning (e.g., grinding) steps to gradually compile an electrical routing (wiring) structure within the secondary substrate level and over the base substrate level.

By virtue of the above-described process steps, a multilevel power substrate is produced including a first substrate level (one of the base and secondary substrate level) containing integrated routing features. Further, the first substrate level is bonded to a second substrate level (the other of the base and secondary substrate level) containing one or more heat spreader regions, which may be relatively voluminous, composed of a material or combination of materials having relatively high thermal conductivities, and which may otherwise be optimized for thermal transfer or heat dissipation. The resulting multilevel power substrate may beneficially offer relatively high thermal performance levels, while further supporting relatively dense electrical routing layouts or wiring schemes. Concurrently, and as briefly noted above, the metallic features of the secondary substrate level may be directly plated onto exposed metallic surfaces or features of the base panel level during manufacture of the multilevel power substrate. This may yield a structurally robust (e.g., metallurgically-bonded) structural interface between metallic features contained in the base substrate level and the plated features of secondary (build-up) substrate level having a high resistance to separation or other structural compromise across repeated thermal cycling of the host RF package. Moreover, dielectric materials contained in the secondary (build-up) substrate level may be directly deposited or overmolded onto the base substrate level following, for example, the creation of a first patterned metal layer on a ground or thinned surface of the base substrate level to provide further direct bonding between the substrate levels. The need for intervening bonding layers between the substrate levels is consequently reduced, if not wholly avoided, to reduce design complexity and minimize junctures between disparate materials, thereby further minimizing the overall thermal resistance and electrical resistance at desired locations through the substrate thickness. As yet another further benefit, embodiments of the multilevel power substrate can be incorporated into wide variety of package formfactors or types including, but not limited to, no-lead packages (e.g., quad flat no-lead (QFN) and dual flat no-lead (DFN) packages), land grid array (LGA) packages, and ball grid array (BGA) packages (with the performance of additional ball attach processes).

In keeping with the foregoing description, and as further discussed below, the multilevel power substrates may be described as containing embedded heat dissipation structures. The embedded heat dissipation structure extend from a first principal surface of the multilevel power substrate (a populated die support surface of the power substrate) to a second, opposing surface of the power substrate (the substrate backside surface) to vertically span the substrate's full thickness or height Embodiments of the embedded heat dissipation structures include at least one thermally-conductive die mount region and a heat spreader region, which contact or meet at a direct plating interface; that is, an interface whereat one of the thermally-conductive die mount and heat spreader regions is plated directly onto the other of the die mount and heat spreader regions. Depending upon the fabrication process employed, the heat spreader region may be directly plated onto the thermally-conductive die mount region; or, conversely, the die mount region may be directly plated onto the heat spreader region of the embedded heat dissipation structure, depending upon the fabrication approach employed. For example, in embodiments in which the prefabricated base structure assumes the form of a leadframe, a leadframe die pad or flag may serve as the heat spreader region; while a high metal content structure (e.g., a solid metal column or block) is plated onto the leadframe die pad to produce the die mount region of the heat dissipation structure. In other instances, the prefabricated base structure may assume the form of an electrically-routed substrate block or interposer, such as a multilayer PCB interposer. In this case, a metallic or high metal content region of the electrically-routed interposer (e.g., a thermally-conductive coin embedded in the PCB interposer) may serve as the die mount region; while a subsequently-plated metallic block, which is compiled onto the PCB interposer during an electroplating process, may serve as the thermally-conductive die mount region of the heat dissipation structure. In either case, the heat spreader region may be imparted with a greater volume than is the thermally-conductive die mount region, and may possess planforms dimensions (e.g., a width and length) greater than those of the die mount region, to provide the desired heat spreading functionality.

Embodiments of the multilevel power substrates are beneficially produced utilizing panel level fabrication processes, which enable the manufacture of a relatively large number of multilevel power substrates in parallel. Further, when so desired, such panel level fabrication process can be extended or leveraged to conveniently enable the fabrication host RF packages in conjunction with mass production of the power substrates in same panel size or a smaller form, such as smaller sized strips. As an example, a first relatively expansive structure or "panel level" containing an array of interconnected base substrate levels may be obtained, whether by independent fabrication or by purchase from a third party supplier. Such a structure is referred to herein as a "base panel level," with the term "panel level" generally referring to a larger structure containing a number of interconnected substrate levels arranged in a horizontally-distributed array, such as a grid or strip layout. Further, as noted above, the term "panel" broadly encompasses any structure containing multiple interconnected units or articles, regardless of the particular formfactor or planform geometry of the panel. A panel may thus have a relatively large square-shaped planform geometry (e.g., have an equivalent width and length ranging from, for example, 400 to 700 millimeters (mm)), an elongated rectangular- or strip-shaped planform geometry (e.g., have a width ranging from 50 to 100 mm and a length ranging from 200 to 300 mm), or any other planform geometry. Further, a given panel (e.g., a having a large, square-shaped planform geometry) may be separated into smaller units (e.g., having strip-shaped planform geometries) at any suitable stage of processing, with such smaller units still considered "panels" subject to further processing and singulation as described below.

In various embodiments, a secondary panel level may be produced over the base panel level, with the overlapping panel levels combining to yield a multilevel substrate panel. At a subsequent juncture of manufacture, the multilevel substrate panel is separated into a plurality of discrete, singulated units. The singulated units each include a multilevel power substrate having a base substrate level (a singulated piece of the base panel level), a secondary substrate level (a singulated piece of the secondary panel level) contacting and bonded to the base substrate level, and at least one heat dissipation structure embedded in the vertically-overlapping levels of the multilevel power substrate. Depending upon the fabrication approach employed, the singulated units can assume the form of multilevel power substrates, considered in isolation, which undergo further post-singulation processing to fabricate the host RF packages. Alternatively, additional process steps may be performed prior to substrate panel singulation to produce any number of RF packages utilizing the fully intact multilevel substrate panel as a foundational structure. In this latter case, the singulated units each assume the form of a complete (or substantially complete) RF package into which a multilevel power substrate is incorporated. Examples of such panel level fabrication processes are described below in connection with FIGS. 3-21. First, however, an example embodiment of an RF power substrate containing a multilevel power substrate is discussed in connection with FIGS. 1 and 2. Lastly, an example of one manner in which microelectronic components (e.g., IC dies or SMDs) may be embedded directly in the secondary substrate level of a multilevel power substrate are further discussed below in connection with FIG. 22.

Example Radio Frequency Package and Multilevel Power Substrate

FIG. 1 is a simplified cross-sectional view of an RF package 20 incorporating a hybrid or multilevel power substrate 22, as illustrated in accordance with an example embodiment of the present disclosure. In addition to power substrate 22, RF package 20 may contain any number and type of microelectronic components or devices, which may be mounted to a populated frontside surface or die support surface 32 of power substrate 22 and encapsulated within a molded package body 30. In the present example, the illustrated region of RF package 20 encompasses three such microelectronic components 24, 26, 28: namely, an SMD 24, a first RF power die 26, and a second RF power die 28. SMD 24 is physically attached to die support surface 32 of multilevel substrate 22 via electrically-conductive (e.g., solder) connections to substrate bond pads 34. SMD 24 can be, for example, a discrete capacitor, resistor, or inductor in embodiments; while RF power dies 26, 28 may be carrier and peaking dies employed within Doherty PA circuit, as further discussed below. This stated, the particular type, number, and purpose of the discrete microelectronic components (e.g., any SMDs) contained within RF package 20 is generally inconsequential to embodiments of the present disclosure, providing RF package 20 contains at least one RF power die bearing RF circuitry, such as a transistor-containing IC utilized for RF signal amplification purposes.

RF power dies 26, 28 are mounted to populated surface of multilevel substrate 22 via electrically-conductive and thermally-conductive bond layers 36, 38, respectively. Bond layers 36, 38 are referred to below as "die attach layers"; however, this terminology is utilized in a non-limiting sense and does not restrict bond layers 36, 38 to formation from conventional die attach materials or any other bond material, providing the chosen bond material is thermally conductive and, perhaps, electrically conductive as appropriate. In the illustrated example, specifically, die attach layers 36, 38 provide mechanical, electrical, and thermal connection to certain thermally-conductive bodies or structures 40, 42 (herein, "thermally-conductive die mount regions 40, 42") embedded in a secondary (build-up) substrate level 44 of multilevel power substrate 22. Thermally-conductive die mount regions 40, 42 further combine with a relatively large thermally-conductive body or "heat spreader region" 48, which is embedded in a base substrate level 46 of power substrate 22, to collectively form an embedded heat dissipation structure 40, 42, 48, which is electrically-active in the illustrated example in that heat spreader region 48 also serves as a terminal of RF package 20. Accordingly, to allow thermal and electrical connection to embedded heat dissipation structure 40, 42, 48, die attach layers 36, 38 may each be composed of a solder, a metal particle-containing die attach material, a sintered metallic material, or another electrically- and thermally-conductive bond materials. Additional electrical interconnections may be provided between non-illustrated bond pads provided on the active frontsides of RF power dies 26, 28 to bond pads 35 (exposed metallic surfaces) present on populated frontside surface 32 of multilevel power substrate 22 via wire bond arrays 49.

As briefly indicated above, multilevel power substrate 22 includes a base substrate level 46 and a secondary substrate level 44, which are bonded in a stacked or vertically-overlapping relationship; again, the term "vertical" herein denoting a direction extending in a package height or substrate thickness direction (parallel to the Y-axis of coordinate legend 62 appearing in FIG. 2). Secondary substrate level 44 is located between base substrate level 46 and microelectronic components 24, 26, 28 mounted to the frontside or die support surface 32 of multilevel power substrate 22; however, in other instances, base substrate level 46 may be located between secondary substrate level 44 and the packaged microelectronic components, as further discussed below in connection with FIGS. 15-21. Generally, then, the descriptor "base" utilized in the term "base substrate level" does not describe the spatial relationship between substrate levels 44, 46, but rather denotes that secondary substrate level 44 is formed on base substrate level 46 during manufacture of multilevel power substrate 22.

RF package 20 is further shown, in bottom planform view, in FIG. 2. Referring jointly to FIGS. 1 and 2, a lower principal surface of base substrate level 46, and more generally multilevel power substrate 22, defines the bottomside of RF package 20 in the illustrated embodiment Base substrate level 46 contains one or more prefabricated structures 48, 50, which are embedded in a base dielectric body 52 composed of a molded thermoset material or another dielectric material. Base structures 48, 50 embedded within dielectric body 52 are "prefabricated" in the sense that structures 48, 50 are manufactured prior to the below-described panel-level fabrication process; and, in the present example, assume the form of singulated leadframe pieces 48, 50. Prefabricated structures 48, 50 specifically include a relatively large, central metallic block, flag, or flange 48 (hereafter, "leadframe die pad 48") and a number of contacts or terminal blocks 50, which may be initially provided in an interconnected leadframe format and subsequently electrically isolated by singulation of the leadframe. As best shown in FIG. 2, leadframe terminals 50 may be arranged in multiple rows flanking two or more sides of leadframe die pad 48. Leadframe die pad 48 may have a volume greater than the cumulative volume of thermally-conductive die mount regions 40, 42 in embodiments. Additionally, leadframe die pad 48 may be sized to have planform dimensions (e.g., a width and length as measured along the X- and Y-axes of coordinate legend 62) exceeding the respective planform dimension of each conductive die mount region 40, 42. In this manner, the volume of embedded heat dissipation structure 40, 42, 48 increases (here, in a stepwise fashion) with increasing distance from RF power dies 26, 28 and increasingly proximity to backside surface 54 of RF package 20 to provide the desired heat spreading functionality. Concurrently, and as discussed more fully below, additional regions are availed within secondary substrate level 44 at elevations above leadframe die pad 48 for more complex or fine pattered metal features, such as electrical routing features and possibly integrated circuit elements.

With continued reference to FIGS. 1 and 2, a lower or backside surface 54 of leadframe die pad 48 is exposed through base dielectric body 52 such that lower surface 54 may be substantially coplanar with a principal backside surface 56 of RF package 20, which is coplanar with (and, in the illustrated example, defined by) the backside surface of power substrate 22. In embodiments, exposed backside surface 54 of leadframe die pad 48 may serve as a thermal (heat extraction) interface of RF package 20 to promote removal of excess heat from the interior of RF package 20 (particularly, at locations adjacent RF power dies 26, 28) by conductive heat transfer through multilevel power substrate 22. Backside surface 54 of leadframe die pad 48 may also serve as an electrically-active package terminal, such as a ground terminal providing electrical connection to (e.g., source) terminals of RF power dies 26, 28, in embodiments. Opposite backside surface 56, RF package 20 has a topside surface 58 defined by an outer principal surface of molded package body 30. RF package 20 thus assumes the form of a QFN or LGA package in the illustrated example; while, in other embodiments, RF package 20 may assume a different form, such as that of another type of flat no-lead package (e.g., dual-flat no-lead (DFN) package) or a micro-leadframe (MLF) package, to list but a few examples.

The circuitry elements or microelectronic components contained within RF package 20, and the correspondingly capabilities of RF package 20, will between embodiments; again noting that a primary benefit of the presently-disclosed multilevel power substrates is an increased design flexibility, including an ability to accommodate relatively dense or complex circuit designs when so desired. In the illustrated embodiment, RF package 20 may serve as, or may form a part of, PA circuit, such as a Doherty PA circuit Such a Doherty PA circuit may also various other components or circuit elements contained within RF package 20, implemented utilizing components mounted to a system-level PCB (e.g., a motherboard), or otherwise provided within the larger system or assembly into which RF package 20 is ultimately incorporated. Such other circuit components can include, for example, phase delay elements (to create the requisite phase delay between carrier and peaking signals), a power splitter (to divide an input RF signal into carrier and peaking portions), input and output impedance matching networks, bias circuitry, a combiner node, and one or more PA stages implemented utilizing RF power dies 26, 28 and possibly additional IC dies contained within or located external RF package 20. To provide a still more specific, albeit non-limiting example, RF power die 26 may serve as a carrier die bearing one or more transistors (e.g., Field Effect Transistors (FETs)) utilized to amplify a carrier signal split from the RF input signal, while RF power die 28 may serve as a peaking die bearing one or more transistors (e.g., FETs) utilized to amplify a peaking signal split from the RF input signal. In such instances, RF power die 26 (the carrier die) may be particularly prone to excess heat generation due to the duration of time during which die 26 remains in a conducting ON state; and, thus, die mount region 40 may be imparted with a greater volume than die mount region 42 in at least some instances. In other embodiments, RF power dies 26, 28 may incorporate another transistor type (e.g., bipolar transistors), and/or RF package 20 may form part of a different amplifier circuit (e.g., a push-pull amplifier) or may not be utilized for RF signal amplification purposes.

Regardless of the particular circuitry integrated RF power dies 26, 28, RF power dies 26, 28 may be fabricated utilizing any suitable die technology and may differ in various respects, depending on the desired functionality of die 26, 28. In embodiments, RF power dies 26, 28 are fabricated utilizing a bulk piece of silicon (Si) or another monolithic (non-layered) piece of semiconductor material. In other embodiments, RF power dies 26, 28 may be produced using a layered die structure. In this latter regard, RF power dies 26, 28 may be produced utilizing produced utilizing a layered (e.g., GaN) die technology in embodiments; e.g., such that an upper portion of each die body is essentially or predominantly composed of a first semiconductor material (e.g., GaN) by weight, while a lower portion of each die body is composed of another material (or combination of materials), such as silicon carbide (SiC), on which the first semiconductor (e.g., GaN) layer is formed. One or both of RF power dies 26, 28 may be prone to excess heat generation during operation depending upon the circuitry integrated into power dies 26, 28, the operational characteristics (e.g., power levels and frequencies) at which RF package 20 is operated, and other factors. For reasons discussed in the following paragraph, multilevel power substrate 22 advantageously permits efficient heat extraction from RF power dies 26, 28 to reduce or eliminate undesirably high peak temperatures within RF package 20.

Multilevel power substrate 22 is able to provide such thermal performance benefits due, at least in part, to the provision of thermally-conductive die mount regions 40, 42 in combination with leadframe die pad 48. Collectively, these elements form a heat dissipation structure 40, 42, 48, which is embedded in power substrate 22 and, in essence, mimics a dual top coin. Leadframe die pad 48 is composed of at least one high thermal conductivity material and will often be principally composed of a metallic material, such as Cu, which may or may not possess a plating finish. As indicated in FIGS. 1 and 2, leadframe die pad 48 may further be imparted with relatively expansive planform dimensions (e.g., a length and width) exceeding those of die mount regions 40, 42; and may thus function as a heat spreader region in the context of heat dissipation structure 40, 42, 48. Thermally-conductive die mount regions 40, 42 are exposed along die mount surface 32 of multilevel power substrate 22 to allow the attachment of RF power dies 26, 28 to die mount regions 40, 42, as previously described. Comparatively, lower surface 54 of leadframe die pad 48 (again, the "heat spreader region" of heat dissipation structure 40, 42, 48) is exposed through base dielectric body 52 and along the backside surface of multilevel power substrate 22. The exposed surface of leadframe die pad 48 consequently serves as a thermal interface of RF package 20. When RF package 20 is installed within a larger electronic assembly or system, such a thermal interface may be left exposed (uncovered) to allow convective heat transfer to the ambient environment More usefully, however, the cooling interface of RF package 20 is thermally coupled to an assembly-level heatsink to further promote excess heat outflow from RF package 20 and dissipation of the excess heat to the ambient environment. Such an assembly-level heatsink can be, for example, a fin array, a metal chassis, or another thermally-conductive structure suitable for absorbing excess heat extracted from RF package 20, particularly in regions within or adjacent RF power dies 26, 28, and convectively transferring excess heat to the surrounding environment. Further, in certain embodiments, leadframe die pad 48 may also serve as a terminal of a RF package 20. In an example implementation in which FETs are integrated into RF power dies 26, 28, the source terminals of the FETs (and power dies 26, 28 generally) may be electrically coupled to leadframe pad 48 through heat dissipation structures 40, 42 and die attach 36, 38.

As noted above, thermally-conductive die mount regions 40, 42 contained within secondary substrate level 44 may be plated directly onto principal interior or inboard surface 60 of leadframe die pad 48, which faces RF power dies 26, 28.

Die mount regions 40, 42 may thus intimately contact and may be metallurgically bonded to the larger leadframe die pad 48, which forms a high thermal conductivity structure (namely, embedded heat dissipation structure 40, 42, 48) emulating a dual top coin. Such a direct plating interface eliminates intervening materials, which may otherwise increase electrical and thermal resistance through the thickness of embedded heat dissipation structure 40, 42, 48 and multilevel power substrate 22, generally. Further, through elimination or minimization of additional material-to-material bond line interfaces, the overall structural integrity or robustness of RF package 20 is enhanced, while fabrication costs associated with RF package manufacture are reduced. As a further advantage, multilevel power substrate 22 supports the incorporation of relatively complex or dense wiring structures into RF package 20. This is achieved, at least in part, through formation of plated metal features 64 within secondary substrate level 44, which are produced within and electrically isolated by a body of dielectric material 66 (hereafter, "secondary dielectric body 66"). Plated metal features 64 assume the form of metal routing features (e.g., Cu traces or interconnect lines, conductive vias, and the like) in the illustrated example. Secondary substrate level 44 may be produced to include any desired number of plated layers of patterned metal features 64 formed in or interspersed with the deposited dielectric layers forming secondary dielectric body 66. Additional description in this regard, and particularly the manner in which secondary substrate level 44 may be compiled onto base substrate level 46 such that substrate levels 44, 46 are intimately bonded along a horizontally-extending interface or surface 68, will now be discussed in connection with FIGS. 3-14 by analogy with the batch production of host RF packages containing multilevel power substrates similar to multilevel substrate 22.

Example Method for Fabricating Multilevel Power Substrates and Host RF Packages Turning to FIG. 3, a generalized method 70 for fabricating a number of multilevel power substrates, and for potentially further fabricating a number of RF packages incorporating the power substrates, is presented in accordance with an example embodiment of the present disclosure. Fabrication method 70 is advantageously performed on relatively large scale or panel level and is consequently referred to as "panel level fabrication method 70" below; again noting that the term "panel," as appearing herein, refers to a relatively expansive, generally flat structure containing an array of interconnected units (e.g., multilevel power substrates, substrate levels, or other portions of RF packages), which is globally processed and ultimately subject to singulation. For purposes of explanation, panel level fabrication method 70 is principally described in connection with fabrication of a small number of RF packages containing multilevel power substrates similar to, though not identical to, RF package 20 and multilevel power substrate 22 discussed above in connection with FIGS. 1 and 2. This example notwithstanding, panel level fabrication method 70 can be utilized to fabricate other multilevel power substrates and, perhaps, other RF packages incorporating such power substrates. To emphasize this point, additional description of another multilevel power substrate and RF package suitably produced utilizing fabrication method 70 is further set-forth below in connection with FIGS. 15-21. Finally, as previously stated, the term "panel" is generally defined herein to encompass any structure containing multiple interconnected units or articles (e.g., packages or modules), which are subsequently subject to singulation, regardless of the particular planform shape or formfactor of the panel. At any juncture during fabrication method 70, a given panel (e.g., a relatively large panel having a square-shaped planform geometry) may be cut into smaller panels (e.g., into strip-shaped panels having elongated rectangular planform geometries), which are then subject to further process; while, in other instances, this may not be the case.

In the illustrated example, panel level fabrication method 70 includes a number of process STEPS 72, 74, 76, 78, 80, 82, 84, 86, 88, 90 each of which is described, in turn, below. STEPS 76, 78, 80, in particular, may be substeps performed during a broader step or SUBPROCESS 74, which is conducted to produce a secondary panel level over a base panel level, which is produced or otherwise obtained during STEP 72 of method 70. More generally, STEPS 72, 74, 76, 78, 80 may be carried-out pursuant to broader SUBPROCESS 92 carried-out to fabricate a number of multilevel power substrates, which are interconnected as a multilevel substrate panel subject to singulation during the final step of method 70 (STEP 90) to separate the multilevel power substrates into individual units or discrete articles. Comparatively, STEPS 84, 86, 88 may be performed pursuant to broader SUBPROCESS 94, which is optionally carried-out when it is desired to fabricate a number of RF packages utilizing the multilevel substrate panel as a foundational structure for increased manufacturing efficiency. When SUBPROCESS 94 is performed, a panel stack is created containing both multilevel substrate panel and an RF package panel, with this panel stack then singulated during STEP 90 to separate the multilevel substrate panel into singulated units. Regardless of whether SUBPROCESS 94 is ultimately carried-out, method 70 enables the fabrication of a relatively large number of multilevel power substrates in an efficient and cost effective manner by global processing of panel structures. Depending upon the particular manner in which panel level fabrication method 70 is implemented, each step generically illustrated in FIG. 3 may entail a single process or multiple sub-processes. Further, the steps illustrated in FIG. 3 and described below are provided by way of non-limiting example only. In alternative embodiments of fabrication method 70, additional process steps may be performed, certain steps may be omitted, and/or the illustrated process steps may be performed in alternative sequences.

Figure 4:
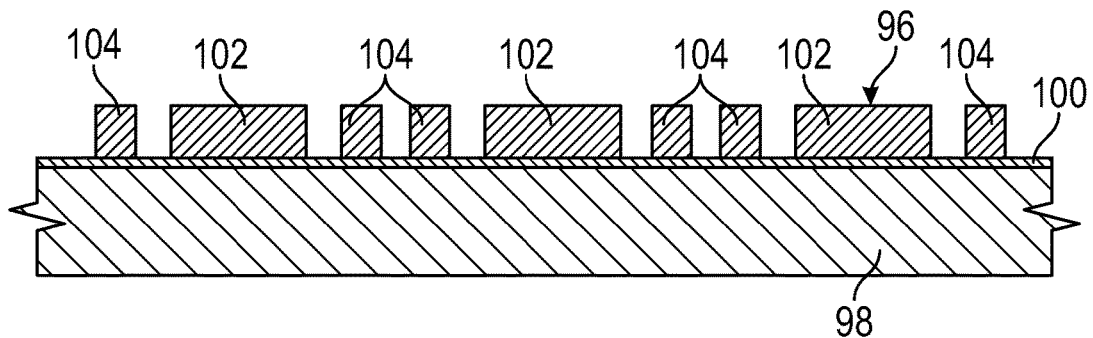
FIGS. 4-14 illustrate a number of RF packages containing multilevel power substrates (here, each similar to the example RF package and multilevel substrate shown in FIGS. 1 and 2), as depicted at various stages of production and fabricated in accordance with the example method set-forth in FIG. 3.

Fabrication method 70 commences with the production of a multilevel substrate panel (SUBPROCESS 92) containing a number of interconnected power substrates, which may be arranged in a horizontally-distributed grid array or strip layout. Initially, during STEP 72, a base panel level is obtained by independent fabrication, by purchase from a third party supplier, or in another manner. The base panel level contains a number of interconnected, pre-singulated base substrate levels, which each contain, in turn, one or more prefabricated structures embedded in a base dielectric material. In one approach, the following actions may be conducted during STEP 72 of method 70. Initially, as shown in FIG. 4, an interconnected, relatively expansive leadframe array 96 may be obtained by, for example, purchase from a leadframe supplier. Leadframe array 96 is attached to a chuck or carrier 98 utilizing, for example, a layer of double-sided adhesive tape 100. Leadframe array 96 may be composed of a metallic material, such as Cu; and may have a thickness ranging from about 10 to about 20 mils in embodiments. In other implementations, leadframe array 96 (and the individual leadframes within array 96) may be thicker or thinner than the aforementioned range. The surfaces of leadframe array 96 may be left bare; or, instead, selected surfaces of leadframe array 96 may be plated with a metallic finish to facilitate bonding with the below-described plating features, including the plated metallic body or block serving as thermally-conductive die attach regions 146 (see FIG. 14). Leadframe array 96 contains a number of leadframes 102, 104, which are spatially distributed in a relatively large grid or strip layout. Leadframes 102, 104 each include a leadframe die pad 102 and a number of leadframe terminals 104, which are analogous to leadframe die pad 48 and leadframe terminals 50 of RF package 20 (FIGS. 1 and 2). For illustrative clarity, only limited portions of leadframe array 96, carrier 98, and tape layer 100 are shown in FIG. 4 and in the other drawing figures (FIGS. 5-13) below; noting that leadframe array 96, carrier 98, and tape layer 100 are considerably larger to enable the fabrication of a relatively large number of multilevel power substrates, and possibly RF packages, in parallel by globally processing the depicted structural arrangement.

Figure 5:
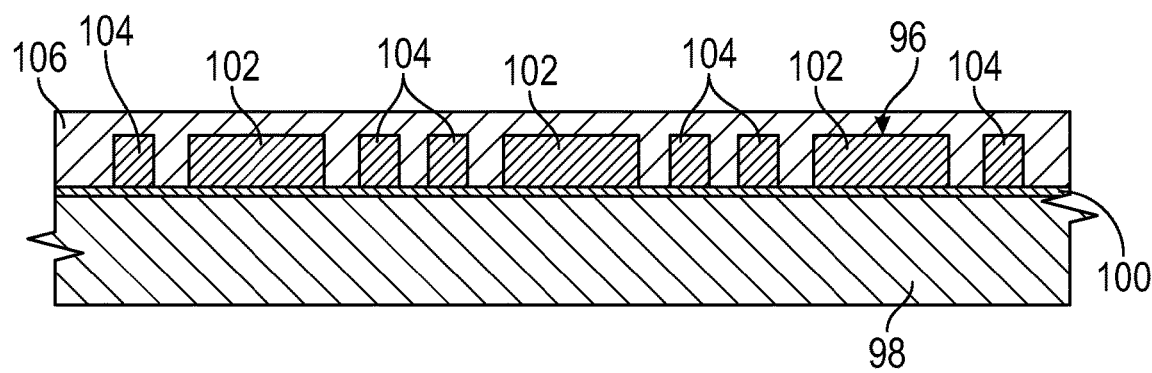
Figure 6:
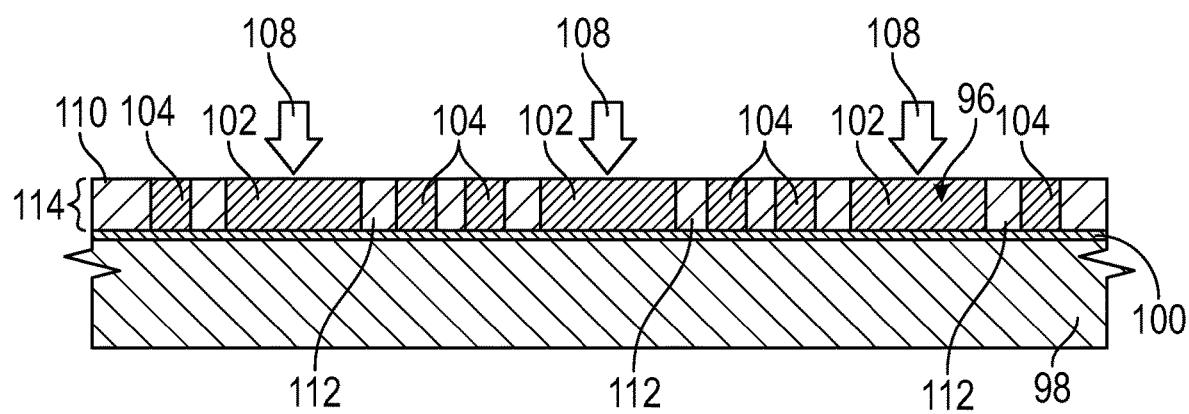

As depicted in FIG. 5, a layer of dielectric material 106 is next deposited over leadframe array 96 and onto carrier 98, with the chosen dielectric material flowing around and into the spaces defined by leadframe die pad 48 and leadframe terminals 50. Dielectric material 106 may be, for example, a thermoset material deposited in a heated, flowable state and in sufficient volume to fully encapsulate leadframe array 96, including leadframe die pads 48 and leadframe terminals 50. Any suitable overmolding process may be employed to deposit dielectric material 106 over leadframe array 96 including dry film, transfer, and injection molding techniques. An example of a dry film molding technique suitable for depositing dielectric material 106 is discussed more fully below. Following this, and as indicated in FIG. 6 by arrows 108, material is removed from the upper surface of dielectric material 106 utilizing a suitable thinning process, such as back-grinding, polishing, or a combination thereof. Sufficient volume is removed from dielectric material 106 to expose the upper metallic surfaces of leadframe array 96; and, therefore, the upper metallic surfaces of leadframe die pad 102 and leadframe terminals 104. This yields a panel-wide dielectric layer 110 (identified in FIG. 6), which contains a number of pre-singulated base level dielectric bodies 112, each corresponding to a different multilevel power substrate (with the depicted region of leadframe array 112 and panel-wide dielectric layer 110 generally encompassing three such power substrates, as will become clear with the discussion set-forth below in connection with FIG. 14). At the conclusion of this stage of manufacture, a base panel level 114 has now been produced to complete STEP 72 of fabrication method 70 (FIG. 3).

Figure 7:
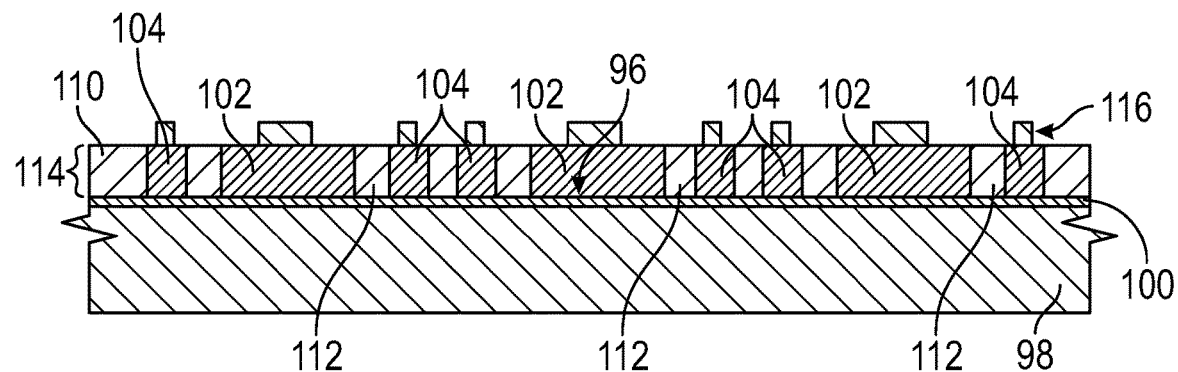
Figure 8:
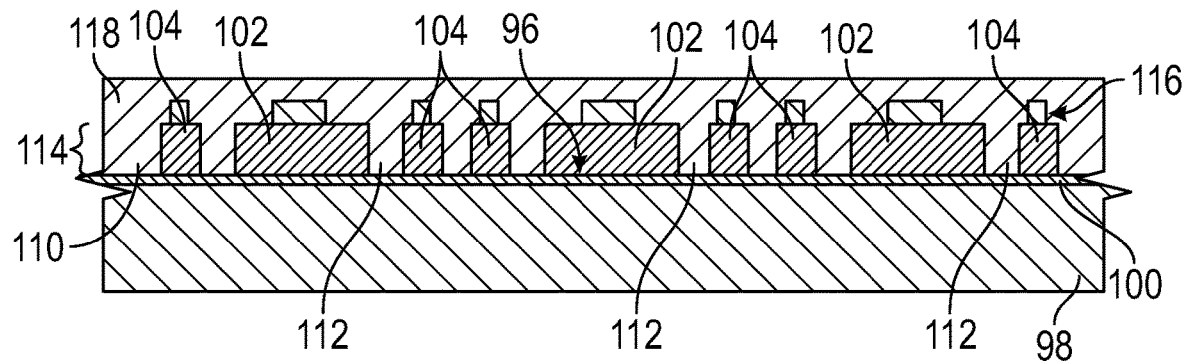
Figure 9:
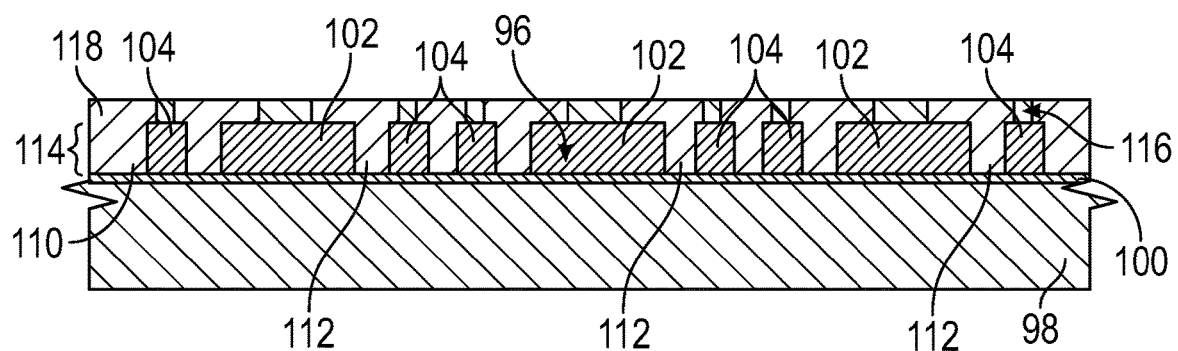

Fabrication method 70 next advances to SUBPROCESS 74 during which a secondary panel level is produced on or over base panel level 114. In one possible approach, a series of STEPS 76, 78, 80 is sequentially performed at least once to compile or build-up layers of plated metal features on base panel level 114, with such plated metal features extending within and supported by a suitable dielectric material. Referring now to FIGS. 7-9, in an initial process step (STEP 76), a first layer of plated metal features 116 is formed on an upper surface of base panel level 108 (FIG. 7). An electroplating process may be utilized to deposit metal features 116 in embodiments following the deposition and lithographical patterning of a photoresist material, with an appropriate electrical bias applied through leadframe array 96 during electroplating. Plating may then be carried-out; e.g., potentially after the sputter deposition of a seed layer or activation of the surface onto which metal features 116 are deposited. Subsequently, at STEP 78, a dielectric material 118, such as an epoxy glob top or a heated thermoset material, is deposited over and around newly-formed plated metal features 116, as shown in FIG. 8. Any overmolding process may be utilized to deposit dielectric material 118; e.g., in one embodiment, a dry film lamination process may be performed across the base panel level 114 by cutting a dry film material to the desired size, placing the cut film over base panel level 114, and then heating the dry film to sufficient temperature, potentially under pressure, to reflow the material into the openings between plated metal features 116. In other instances, a different overmolding process (e.g., transfer molding or injection molding technique) may be utilized. Excess dielectric material 118 or mold overburden may be deposited to fully encapsulate the newly-plated metal features 116, with panel thinning (e.g., back-grinding) then performed at STEP 80 to remove the material overburden and thereby expose the plated metal features through the surface of encapsulant body 112. The structure shown in FIG. 9 results.

Figure 10:
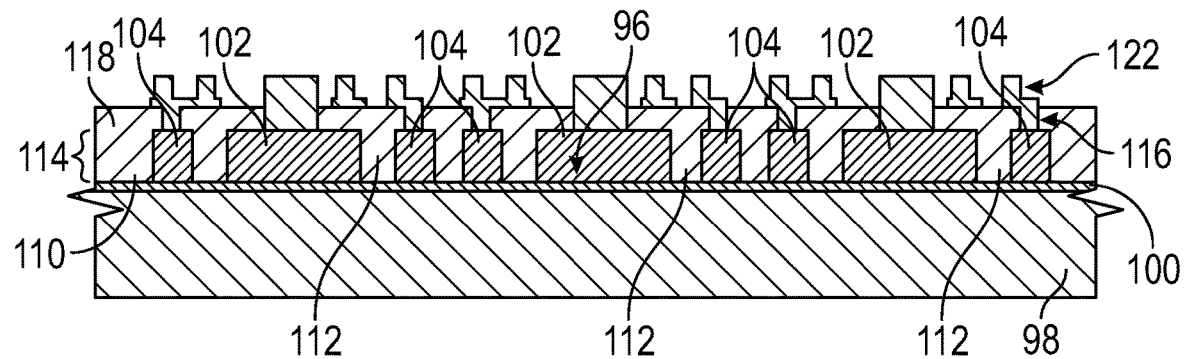
Figure 11:
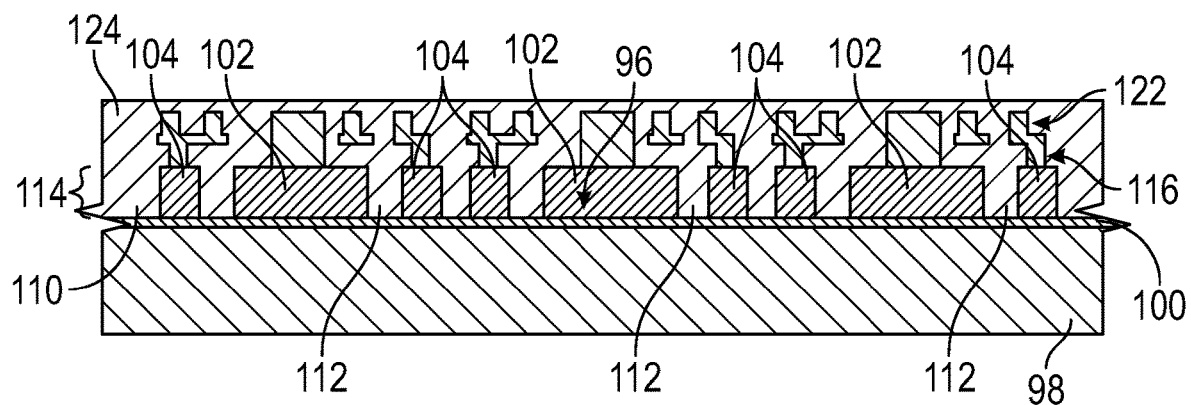
Figure 12:
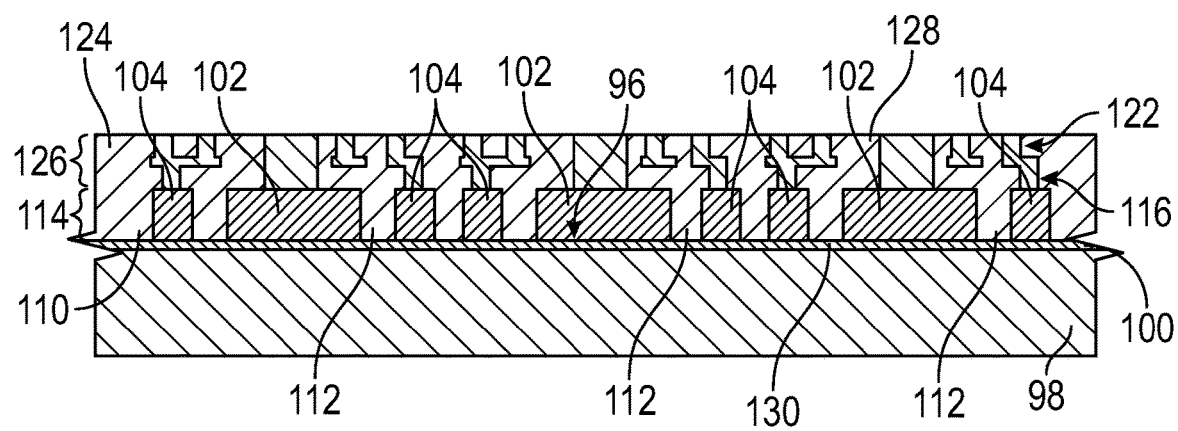

As indicated in FIG. 3 by a decision node 120, the above-described plating, overmolding, and thinning (e.g., back-grinding steps) steps can be performed a single time or, perhaps, multiple times to compile additional layers of patterned metal features (e.g., Cu interconnect lines or other electrical routing features) in embodiments. In the illustrated example, specifically, at least one additional iteration of STEPS 76, 78, 80 may be conducted, as schematically depicted in the cross-sections of FIGS. 10-12. Accordingly, one or more additional layers of (e.g., Cu) plated metal features 122 may be deposited over and in contact with the exposed surfaces of the previously-deposited plated metal features 116 (FIG. 10). The above-described electroplating process may be carried-out, with each layer of patterned metal features 116 having a final thickness ranging from, for example, between about 50 and about 100 microns (μm). Following this, one or more layers of dielectric material 124 may be deposited over each layer of metal features 122 in sufficient volume to create an overburden portion (FIG. 11); and back-grinding or a similar material removal process may be carried-out to thin the newly-deposited dielectric layers 124 and reveal the uppermost surfaces of the final plated metal layer (FIG. 12). Ultimately, such process steps result in the production of a secondary panel level 126, which is formed on and combines with base panel level 114 to yield a multilevel substrate panel 114, 126. Multilevel substrate panel 114, 126 includes, among other features, a panel-wide die support surface 128 at which metallic surfaces (e.g., bond pads) of the plated metal features 116, 122 contained in secondary panel level 126 are exposed. Opposite panel-wide die support surface 128, as taken in a substrate thickness direction (that is, along an axis orthogonal to die support surface 128), multilevel substrate panel 114, 126 further includes a panel-wide die backside surface 130. Lower or bottomside surfaces of leadframe die pads 102 and leadframe terminals 104 are further exposed along (and may be substantially coplanar with) panel-wide backside surface 130 to, for example, allow thermal and electrical contact to die pads 102 and terminals 104 following removal of multilevel substrate panel 114, 126 from carrier 98 and singulation of substrate panel 114, 126 into discrete singulated units. This completes SUBPROCESS 74 of fabrication method 70.

With continued reference to FIG. 3 in conjunction with the sequential fabrication steps outlined in FIGS. 4-14, fabrication method 70 now advances to STEP 82. A query is posed at this step, with either of two divergent process paths followed depending upon whether it is desired to separate multilevel substrate panel 114, 116 (FIG. 12) into singulated units (multilevel power substrates) prior to or subsequent to the fabrication of the RF packages into which the multilevel power substrates are incorporated. When it is desired to separate multilevel substrate panel 114, 116 (FIG. 12) into singulated units prior to RF package manufacture, the query posed at STEP 82 is answered in the affirmative, and fabrication method 70 advances to STEP 90. In this case, multilevel substrate panel 114, 116 (FIG. 12) is separated into a plurality of discrete units in the form of discrete multilevel power substrates. Sawing (e.g., separation utilizing a water-cooled dicing saw) or any other suitable singulation process may be utilized to separate multilevel substrate panel 114, 116 into pieces or singulated units. Such multilevel power substrates may then undergo further processing following singulation to produce the host RF package containing the power substrate at any subsequent juncture, with such process steps potentially performed by a different entity (e.g., a customer) other than the entity (or entities) that carried-out SUBPROCESS 92 of method 70. Alternatively, in other embodiments, additional process steps may be performed prior to panel structure singulation to initiate, and perhaps to complete, fabrication of RF packages utilizing the multilevel substrate panel as a foundation or base. In this instance, the query posed at STEP 82 is answered in the negative, and method 70 advances to SUBPROCESS 94 during which a number of RF packages are fabricated on the newly-produced multilevel substrate panel 114, 116, as will now be described below in connection with FIGS. 13 and 14.

Figure 13:
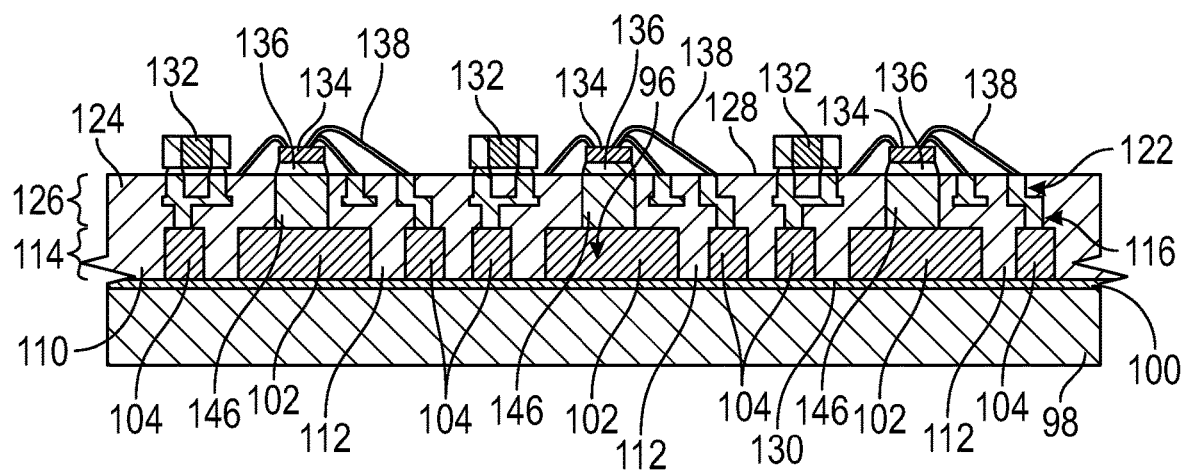

Advancing to FIG. 13, in embodiments in which multilevel substrate panel 114, 116 is subject to further processing to produce, in part or in whole, a plurality of RF packages prior to panel singulation the following steps. As indicated in FIG. 3 at STEP 84, number of microelectronic components 132, 134 are attached to metal surfaces or bond pads of plated metal features 116, 122 exposed along frontside or die support surface 128 of substrate panel 114, 116. In the illustrated example, the attached microelectronic components 132, 134 include an SMD 132 and IC dies in the form of RF power dies 134. In a manner akin to that described above in connection with FIGS. 1 and 2, SMDs 132 may be electrically coupled and physically mounted to panel-wide die support surface 128 of multilevel substrate panel 114, 116 by solder attachment Comparatively, RF power dies 132 are mounted to panel-wide die support surface 128 of multilevel substrate panel 114, 116 via die attach layers 136, which may be composed of solder, an electrically-conductive (e.g., metal particle-containing) die attach material, a sintered material (e.g., predominantly composed of sintered silver (Ag), Cu, gold (Au), or a combination thereof), or a like electrically- and thermally-conductive bonding material. Additional electrical connections may be provided between RF power dies 134 and bond pads present on panel-wide die support surface 128 of multilevel substrate panel 114, 116 via the formation of wire bonds 138 (STEP 86, FIG. 3) by ball bonding or utilizing another wirebonding process, if so desired. Microelectronic components 132, 134, wire bonds 138, and any other features present along panel-wide die support surface 128 may then be encapsulated (STEP 88, FIG. 3); and the resulting structure or panel stack may be separated into singulated RF packages by sawing or utilizing another singulation technique (STEP 90, FIG. 3). This may be fully appreciated by referring to FIG. 14, which illustrates a number of RF packages 140 produced pursuant to encapsulation of microelectronic components 132, 134 (yielding a panel-wide overmold body 142) and subsequent singulation of multilevel substrate panel 114, 116 into discrete, physically-separated units. This concludes the present iteration of example method 70 (FIG. 3), resulting in the fabrication of RF packages 140 each containing a multilevel power substrate 144.

Figure 14:
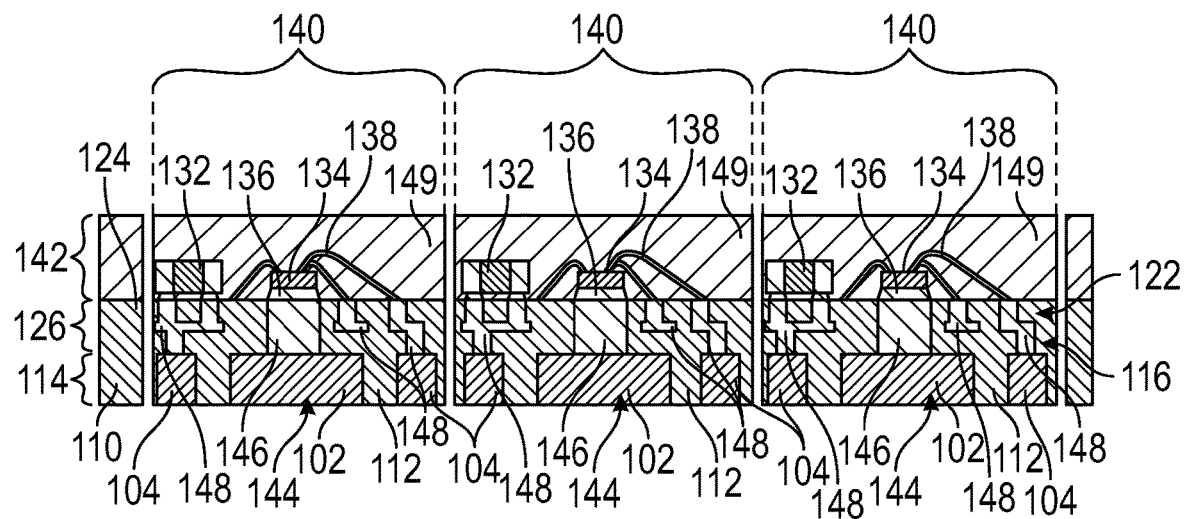

Referring further to FIG. 14, it can be seen that each RF package 140 produced pursuant to fabrication method 70 contains, among other prominent features, a multilevel power substrate 144. Each multilevel power substrate 144 is composed of: (i) a base substrate level formed from a singulated piece of base panel level 114, and (ii) a secondary substrate level formed from a singulated piece of secondary substrate level 126, bonded to the overlying base panel level, and containing metal routing features electrically interconnecting the packaged microelectronic components with the metallic features (here, terminal blocks 104 and central die pad 102) embedded in the base substrate level. Further, at least one heat dissipation structure 102, 146 is embedded within each multilevel power substrate 144, which functions to provide a high thermal conductivity path extending from an RF power die 134 to the thermal interface of RF package 140. More specifically, in the case of each completed RF package 140, the embedded heat dissipation structures 102, 146 is formed in both the base secondary substrate levels of the power substrate 144, with the heat dissipation structures 102, 146 vertically spanning the thickness or height of the multilevel power substrates 144. In keeping with the description above, each embedded heat dissipation structures 102, 146 is fabricated to include a heat spreader region (here, leadframe die pad 102) exposed along the backside surface of the multilevel power substrate 144, as well as a thermally-conductive die mount region 146 (here, plated metallic blocks or columns projecting upwardly from die pads 102 toward IC dies 134) exposed along the frontside or die support surface of the power substrate 144. The thermally-conductive die mount region 146 is joined to heat spreader region (leadframe die pad 102) at a direct plated interface, which is formed at the juncture of the base and secondary substrate levels in the manner previously described.

By virtue of the above-described structural features, a volumetrically-robust, low thermal resistance heat conduction path is thereby created for conducting excess heat generated by RF power dies 134 to the backside thermal interface of each RF package 140 (here, formed by the bottom surface of die pads 102 exposed along the backside of each RF package 140). So too is a low electrical resistance path created through heat dissipation structure 102, 146 for electrically coupling a (e.g., source) terminal of each RF power dies 134 to heat spreader region 102, which may serve as a (e.g., ground) terminal of RF package 140; noting, specifically, that each RF power die 144 is electrically coupled to heat spreader region 102 through die mount region 146 and the electrically-conductive bond layer or die attach layer 136. Concurrently, through the formation of plated routing features 148 within the secondary substrate level, each multilevel power substrate 144 may be imparted with a greater routing complexity or density than otherwise possible if produced utilizing a conventional RF power substrate, such as a non-hybrid leadframe based substrate. Finally, in the illustrated example, each RF package 140 also includes a molded package body 149 encapsulating the packaged components 132, 134 and bonded to the frontside or die support surface of the multilevel power substrate 144 to impart RF packages 140 with a flat no-lead or LGA formfactor. In other implementations, various other package designs may be employed incorporating completed multilevel power substrates 144.

Additional Examples of Radio Frequency Package and Multilevel Power Substrate Fabrication The foregoing has thus described an example implementation of fabrication method 70 (FIG. 3) in connection with FIGS. 4-14. In the above-described example implementation of method 70, the prefabricated base structure assumes the form of a leadframe (leadframe 102, 104), with a leadframe die pad (die pad 102) serving as the heat spreader region of an embedded heat dissipation structure (heat dissipation structure 102, 146), which is contained in a multilevel power substrate (power substrate 144). Further, in the above-described example implementation, one or more high metal content (e.g., solid, block-shaped or columnar) regions (regions 146) are plated onto the leadframe die pad to form the thermally-conductive die mount region of the embedded heat dissipation structure. In other instances, the prefabricated base structure (or base structures) contained in the base substrate level may assume the form of another structure having metallic regions or features onto which the metallic features of the secondary substrate level are plated. For example, in further embodiments, the prefabricated base structure may assume the form of an electrically-routed interposer, with a metallic region of the electrically-routed interposer serving as the thermally-conductive die mount region. In this latter case, a subsequently-plated metallic block, which is built-up onto the PCB interposer along with a number of terminal blocks or contacts, may serve as the thermally-conductive die mount region of the embedded heat dissipation structure. Further illustrating this point, an additional iteration of method 70 will now be described in connection with FIGS. 15-21.

Figure 15:
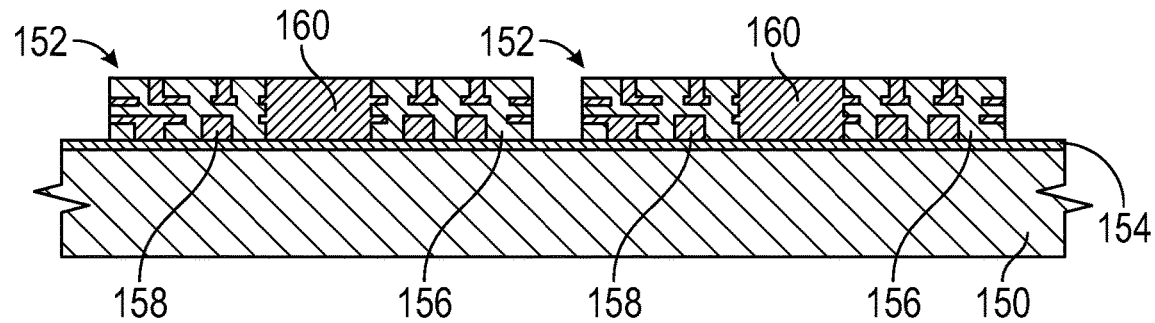
FIGS. 15-20 illustrate a number of RF packages containing multilevel power substrates, as depicted at various stages of production and likewise fabricated in accordance with a further example implementation of the fabrication method set-forth in FIG. 3.

Referring now to FIG. 15, there is shown a portion of a carrier 150 over which an array of prefabricated base structures 152 is distributed. For example, in one embodiment, prefabricated base structures 152 may be purchased from a third party supplier as strips and positioned over carrier 150 utilizing a pick-and-place tool. In other instances, prefabricated base structures 152 can be obtained as a larger, interconnected structure, such as a relatively large panel having a square-shaped planform geometry. As was previously the case, prefabricated base structures 152 may be attached to the upper surface of carrier 150 utilizing double-sided adhesive tape 154. In this example, prefabricated base substructures 152 assume the form of PCB interposers and are referred to as "PCB interposers 152" hereafter. Each PCB interposer 152 includes a dielectric body 156 in which metal features are formed including routing features 158 and a thermally-conductive die mount region 160. Each PCB interposers 152 may be a double-sided PCB lacking intermediate or internal routing layers in embodiments; or, instead, may be multilayer PCBs including any number (e.g., one to ten or more) internal routing layers. Comparatively, thermally-conductive die mount region 160 can be any high thermal conductivity structures or bodies embedded within the respective dielectric bodies of PCB interposers 152 and capable of efficiently conducting excess heat from the RF power dies to heat spreader regions of the embedded heat dissipation structure (e.g., plated features 168) ultimately contained in the completed multilevel power substrate (e.g., power substrate 192, discussed below in connection with FIG. 21). In various implementations, thermally-conductive die mount regions 160 may assume the form of metallic coins or blocks predominately composed of a metallic material, such as Cu, Au, Ag, aluminum (Al), or nickel (Ni), and alloys thereof, by weight. In other embodiments, die mount regions 160 may be fabricated from a composite material or a non-metallic material having relatively high thermal conductivities. Such materials include, but are not limited to, diamond polycarbonate materials, diamond-metal composites (e.g., diamond Au, diamond Ag, and diamond Cu), Cu graphite, pyrolytic graphite, and materials containing allotropes of carbon, such as graphene and carbon nanotube-filled materials.

Figure 16:
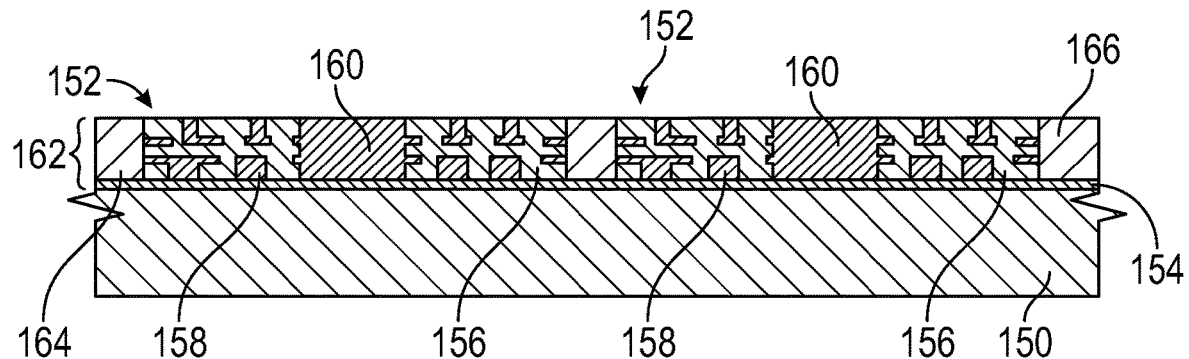
Figure 17:
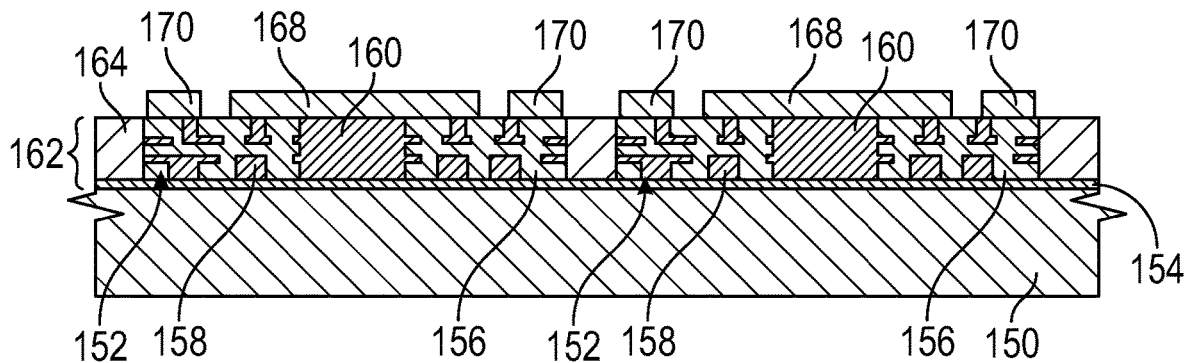

A dielectric material is next dispensed over the spatially-distributed array of PCB interposers 152 utilizing, for example, a transfer film molding process of the type described above. Overburden or excess material form the newly-deposited dielectric body is thinned (e.g., by back-grinding) to reveal the upper surfaces of PCB interposers 152 through the upper surface or frontside of the resulting dielectric body. The resulting structure is shown in FIG. 16, with the production of a base panel level 162 including a base dielectric body 164 having an upper surface or frontside 166 (opposite carrier 150) through which the upper surfaces of PCB interposers 152 are exposed and with which the PCB interposer upper surfaces may be substantially coplanar. In further implementations, PCB interposers 152 may remain physically interconnected during this stage of the manufacturing process (method 70) such that overmolding and formation of base dielectric body 164 is omitted. In either instance, this completes SUBPROCESS 72 of fabrication method 70 (FIG. 3), which progresses to production of the secondary panel level on base panel level 162. Once again, during SUBPROCESS 74, a patterned layer of plated metal features 168, 170 is formed on base panel level 162, with patterned metal features 168, 170 plated onto exposed metal surfaces of PCB interposers 152 embedded in panel level 162. An electroplating process is conveniently utilized to deposit at least one layer of plated metal features 168, 170 over and onto base panel level 162, with the plated metal features 168, 170 formed in electrical contact (e.g., intimately contacting and metallurgically bonded to) metal features contained within panel level 162 and, in the illustrated example, specifically metal features contained within PCB interposers 152 embedded within panel level 162. In contrast to the previously-described iteration of method 70, however, a single, relatively thick layer of patterned metal features 168, 170 is deposited formed on base panel level 162 and embedded PCB interposers 152. This layer of patterned metal features 168, 170 is produced to include relatively expansive (e.g., solid) metal blocks 168 serving as heat spreader regions (hereafter, "plated heat spreader regions 168"), as well as plated terminal blocks 170 spaced from and flanking heat spreader regions 168. In one implementation, for example, patterned metal layer 168, 170 may be predominately composed of plated Cu, by weight, and may have a final (post-grinding) thickness ranging from about 400 to 500 µm. In other embodiments, patterned metal layer 168, 170 may be composed of a different metallic material and/or may have a final thickness greater than or less than the aforementioned range.

Figure 18:
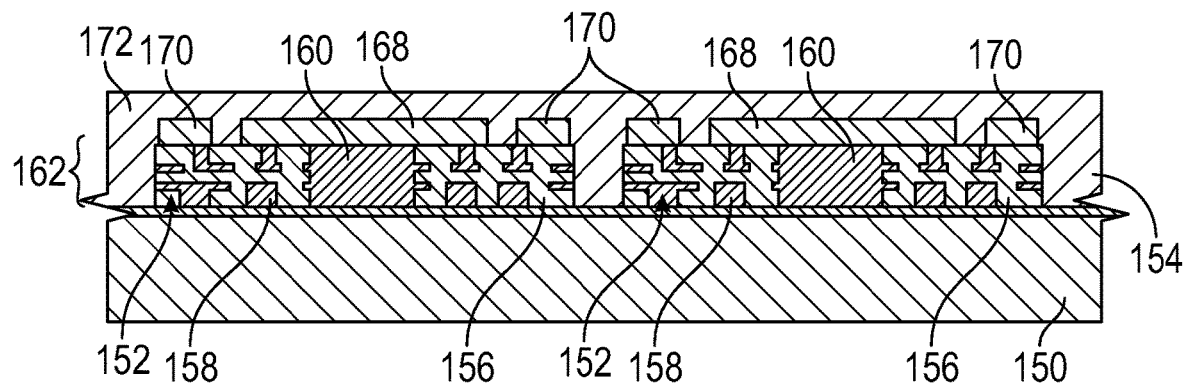
Figure 19:
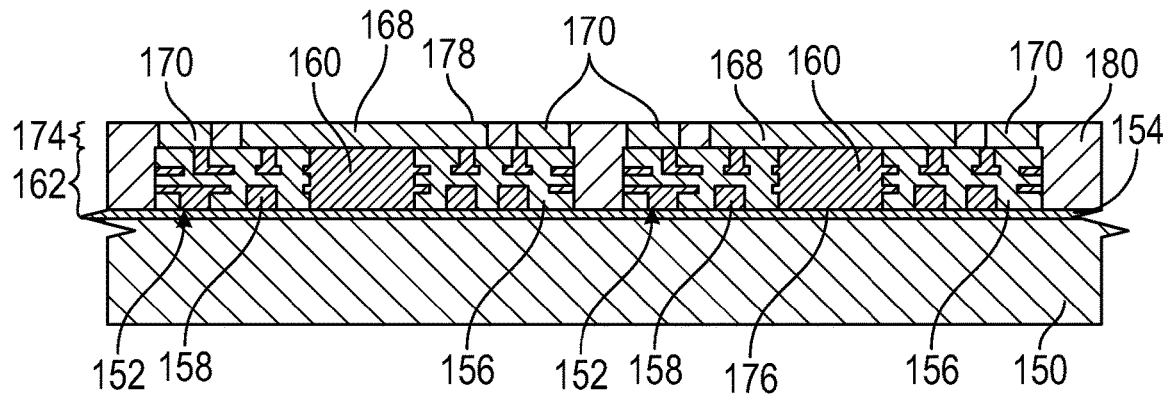

Dielectric material may be deposited over patterned metal layer 168, 170 in sufficient volume to create a dielectric overburden region 172, as identified in FIG. 18; and back-grinding or another material removal process may be carried-out to the reveal the upper surfaces of patterned metal layer 168, 170, as shown in FIG. 19. This results in the production of a secondary panel level 174 formed over, contacting, and bonded to base panel level 162. Jointly, secondary panel level 174 and base panel level 162 combine to yield a multilevel substrate panel 162, 174, only a limited portion of which is shown in the accompanying drawing figures. Multilevel substrate panel 162, 174 is imparted with a panel-wide die support surface 176 at which metallic surfaces, including surfaces of routing features 158 and thermally-conductive die attach regions 160, contained in base panel level 162 are exposed. Opposite panel-wide die support surface 176, as taken in a substrate thickness direction, multilevel substrate panel 162, 174 includes a panel-wide die backside surface 178 partially defined by a secondary dielectric body 180 in which patterned metal features 168, 170 of secondary panel level 174 are embedded. As indicated in FIG. 19, lower surfaces of plated heat spreader regions 168 and plated terminal block or contacts 170 are exposed along, and may be substantially coplanar with, panel-wide backside surface 178. This completes SUBPROCESS 74 of fabrication method 70 (FIG. 3). In certain implementations, fabrication method 70 may proceed to STEP 90 and multilevel substrate panel 162, 174 may be subject to singulation prior to further RF package fabrication. Alternatively, and in a manner analogous to that previously described, method 70 may progress to SUBPROCESS 94 and leverage the newly-produced multilevel substrate panel 162, 174 as a foundational substrate on which a plurality of RF packages are produced, as further discussed below in connection with FIGS. 20 and 21.

Figure 20:
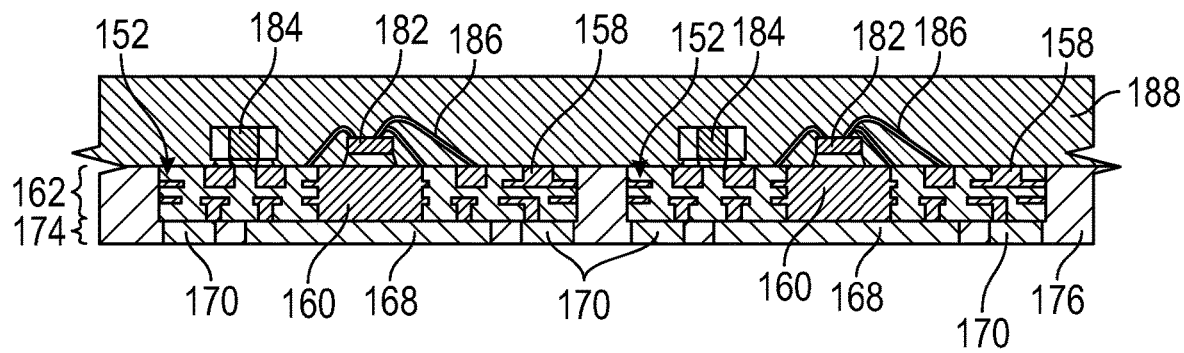

Progressing to FIG. 20, in embodiments in which multilevel substrate panel 162, 174 is subject to further processing to produce a plurality of RF packages, multilevel substrate panel 162, 174 may be removed from carrier 150, inverted or flipped, and attached to another carrier or support platen (not shown). The desired microelectronic components may then be positioned over and attached to die support surface 176 of multilevel substrate panel 162, 174 (STEP 84, FIG. 3); additional electrical interconnections (e.g., wire bonds) may be formed as appropriate (STEP 86, FIG. 3); and overmolding may be conducted (STEP 88, FIG. 3) when desired. An example of the resulting panel structure or stack, which includes a molded panel layer spanning and bonded to multilevel substrate panel 162, 174, is depicted in the cross-section of FIG. 20. As can be seen, RF power dies 182 and SMDs 184 are mounted to die support surface of multilevel substrate panel 162, 174; electrically interconnected utilizing electrically-conducting bonding materials and wire bonds 186; and encapsulated in a panel-wide dielectric layer 188. Sawing or another singulation process is subsequently conducted to separate the resulting structure into individual RF packages 190, each containing a multilevel power substrate 192 (STEP 90, FIG. 3). An example of one such completed RF package 190 produced pursuant to singulation of multilevel substrate panel 162, 174 and the overlying device-containing panel is shown in greater detail in FIG. 21, as described below.

Figure 21:
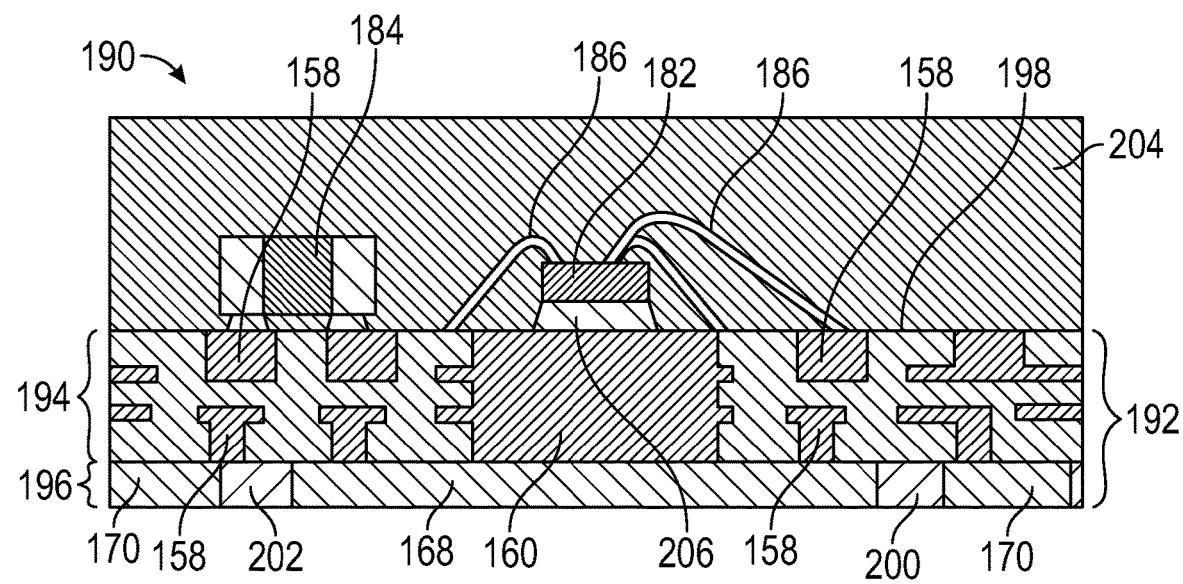
FIG. 21 is a simplified cross-sectional view of a RF package containing a multilevel power substrate, shown in a completed stage, and produced in conjunction with the RF packages and multilevel power substrates shown in FIGS. 15-20.

As shown in FIG. 21, completed RF package 190 includes a multilevel power substrate 192 including a base substrate level 194 formed from a singulated piece of base panel level 162, and a secondary substrate level formed from a singulated piece of secondary substrate level 174. An embedded heat dissipation structure 160, 168 is located within multilevel power substrate 192. Heat dissipation structures 160, 168 includes a plated heat spreader region 168 exposed along backside surface 200 of multilevel power substrate 192, as well as a thermally-conductive die mount region 160 (e.g., a PCB-embedded coin) exposed along the frontside or die support surface 198 of the multilevel power substrate 192. Die mount region 160 is joined to heat spreader region (leadframe die pad 102) at a direct plated interface formed between the base substrate level and the secondary substrate level of power substrate 144. Further, heat spreader region 168 is imparted with greater planform dimensions than is the die mount region 160 embedded in PCB interposer 152 such that heat dissipation structure 160, 168 increases in volume with increases distance from RF power die 182, as taken in a package height or substrate thickness direction. RF package 190 also includes a molded package body 204 encapsulating the packaged components 182, 182 and bonded to the die support surface of multilevel power substrate 192 to impart package 190 with a flat no-lead or LGA formfactor.

By virtue of the above-described structural features, a volumetrically robust, low thermal resistance heat conduction path is created for efficiently extracting excess heat generated by RF power die 182 via conductive transfer to the backside thermal interface of each RF package 190; here, formed by the bottom surface of plated metal block 168 exposed along the backside of RF package 190. Heat spreader region 168 may also serve as a terminal of RF package 190 in at least some embodiments to, for example, provide an electrical connection to RF power die 182 through embedded heat dissipation structure 160, 168. Accordingly, RF power die 182 is mounted to the frontside surface of plated metal block 168 utilizing a suitable thermally- and electrically-conductive bond material 206, such as solder or sintered material, to further help provide low thermal and electrical resistance connections to heat spreader region 168. Concurrently, through the formation of plated routing features 148 within the secondary substrate level, each multilevel power substrate 192 may be imparted with a greater routing complexity or density than otherwise possible if produced utilizing a conventional RF power substrate, such as a non-hybrid leadframe-based substrate. The end result is an RF package 190 containing a unique multilevel power substrate 192 and having optimized thermal and electrical performance characteristics, having a relatively high structural robustness or reliability, and amenability towards cost-effective manufacture, particularly when produced utilizing a large scale, panel-level fabrication process of the type described above in connection with FIGS. 15-20.

Example of Multilevel Power Substrates Containing Embedded Components

Figure 22:
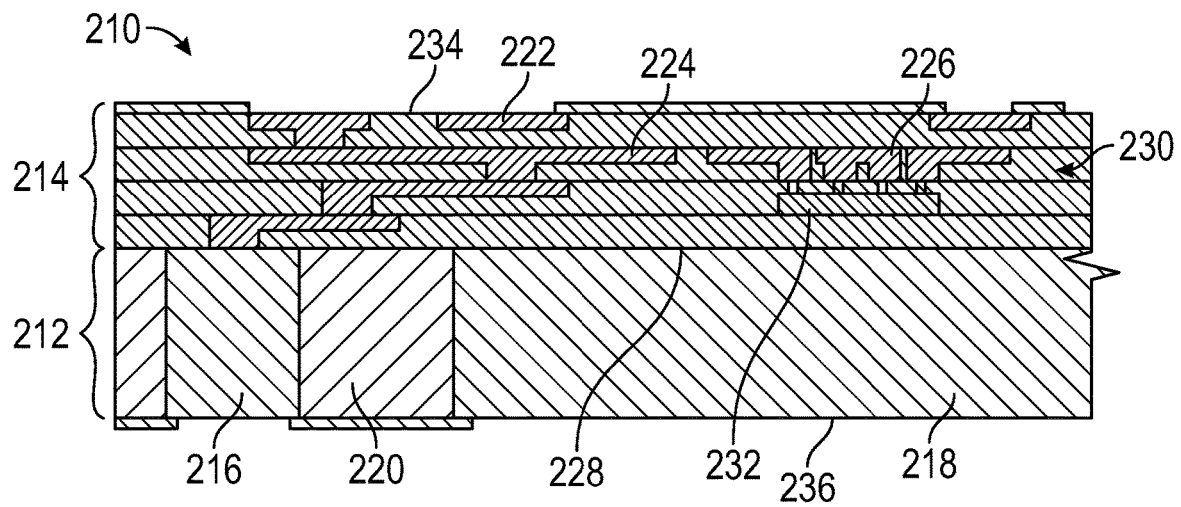
FIG. 22 is a simplified cross-sectional view of a limited region of an RF package containing a multilevel power substrate and illustrating one manner in which a microelectronic devices, such as a relatively small integrated circuit die or a surface mount device, can embedded within the secondary (build-up) level of the power substrate in embodiments of the present disclosure.

Referring lastly to FIG. 22, there is shown a simplified cross-sectional view of an outer peripheral region of a multilevel power substrate 210, which includes a base substrate level 212 and an overlying secondary substrate level 214. In many respects, multilevel power substrate 210 is similar to multilevel power substrate 22 described above in connection with FIGS. 1 and 2. For example, as was previously the case, secondary substrate level 214 is compiled onto, and thus intimately contacts and is directly bonded to, base substrate level 212. Additionally, base substrate level 212 once again contains singulated leadframe piece 216, 218, which including leadframe terminal blocks 216 and a relatively large, central metal block referred to as a "leadframe die pad 218." Leadframe pieces 216, 218 are embedded in a base dielectric body 220 and have upper surfaces coplanar with the upper surface of dielectric body 220; that is, the surface of dielectric body 220 facing the frontside or die support surface 234 of power substrate 210. Comparatively, secondary substrate level 214 contains plated metal features 222, 224, 226 are directly deposited onto a surface 228 of base substrate level 212 and embedded in a dielectric body 230. Plated metal features 222, 224, 226 define routing features and bond pads to provide the desired electrical interconnections between the metallic features of base substrate level 212 and the microelectronic components (e.g., RF power die or dies) ultimately mounted to die support surface 234 of multilevel power substrate 210.

In contrast to multilevel power substrate 22 (FIGS. 1 and 2), multilevel power substrate 210 further contains one or more relatively small IC dies or SMDs, which are directly embedded in the dielectric build-up layers or dielectric body 230 of secondary substrate level 214. Specifically, the illustrated region of multilevel power substrate 210 contains one such embedded component in the form of a relatively small IC die, which is embedded within dielectric body 230 in an inverted orientation. In this manner, the contacts or terminals of IC die 232 are availed for contact with metal routing features 226 as the dielectric and metal layers are sequentially compiled over base substrate level 212 to build-up secondary substrate level 214 in the manner previously discussed. Collectively, certain ones of plated metal features 222, 224, 226 provide the desired electrical connections between embedded IC die 232, the terminals of multilevel power substrate 210 (here, formed by the lower surfaces of leadframe pieces 216, 218 exposed along the backside 236 of power substrate 210), and the microelectronic components (e.g., RF power dies) eventually mounted to die support surface 234 of power substrate 210. By embedding component 232, and potentially any number of additional components within secondary (build-up) substrate level 214 of multilevel power substrate 210 in this manner, power substrate 210, and the RF package into which power substrate 210 is integrated, may be imparted with still further compact designs, greater densities, and enhanced functionalities. Finally, although not shown in FIG. 22, one or more plated metal blocks or columns may further be formed in dielectric body 230 and extend from frontside 234 to the interlevel interface 228 to contact leadframe die pad 218 to form an embedded heat dissipation structure analogous to those described above in connection with FIGS. 1-21.

CONCLUSION

Multilevel power substrates, and RF packages incorporating such substrates, have been provided. Generally, embodiments of the multilevel power substrate are produced to include a first level (one of the base substrate level and the secondary substrate level) containing routing features bonded to a second level (the other of the base substrate level and the secondary substrate level) containing a relatively voluminous heat dissipation structure. The metallic features of the secondary substrate level may be directly plated onto the base substrate level in embodiments to reduce or eliminate need for intervening bonding layers. The resulting multilevel power substrate may thus provide high thermal performance levels, while supporting relatively dense electrical routing or wiring schemes. Additionally, embodiments of the RF power substrates may be relatively robust; enable the embedment of relatively small microelectronic components, such as IC dies and SMDs, into the power substrate; and be amenable to large scale, low cost manufacturing processes to reduce the overall fabrication costs and production duration of the RF packages and power substrates. As a still further benefit, embodiments of the multilevel power substrate can be incorporated into various different package designs or types including, but not limited to, leaded package designs (including both fully encapsulated and air cavity packages), no-lead package designs (e.g., QFN and DFN packages), and LGA package designs.

In an embodiment, the method for fabricating multilevel power substrates incorporated into RF packages includes producing a multilevel substrate panel comprised of a presingulated array of multilevel power substrates. The multilevel substrate panel is produced by obtaining a base panel level containing prefabricated base structures and having a surface through which metallic surfaces of the prefabricated base structures are exposed, and forming a secondary panel level on the base panel level, the secondary panel level including patterned metal features embedded in a secondary dielectric body and electrically contacting the exposed metallic surfaces of the prefabricated base structures at a direct plated interface. The presingulated array of multilevel power substrates is into singulated multilevel power substrates each including a base substrate level formed from a singulated piece of the base panel level and a secondary substrate level formed from a singulated piece of the secondary substrate level. Further, in certain implementations, the method may further include the steps or processes of: (i) producing the multilevel substrate panel to have a panel-wide die support surface and a panel-wide backside surface opposite the panel-wide die support surface, as taken in a substrate thickness direction; and, (ii) in conjunction with producing the multilevel substrate panel, creating heat dissipation structures in the base panel level and in the secondary panel level extending from the panel-wide die support surface to the panel-wide backside surface. IC dies (e.g., RF power dies) may further be attached to the panel-wide die support surface and electrically interconnected the IC dies with routing features contained in the multilevel substrate panel prior to separating the presingulated array of multilevel power substrates into singulated multilevel power substrates.

Multilevel power substrates for incorporation into an RF package have further been disclosed. In an embodiment, the RF package includes a base substrate level, a secondary substrate level formed over and bonded to the base substrate level, a die support surface defined by a first of the base substrate level and the secondary substrate level, and a backside surface defined by a second of the base substrate level and the secondary substrate level. The backside surface is located opposite the die support surface taken in a substrate thickness direction. An embedded heat dissipation structure is formed in the base substrate level and in the secondary substrate level. The embedded heat dissipation structure includes a heat spreader region exposed along the backside surface of the multilevel power substrate, as well as a thermally-conductive die mount region exposed along the die support surface of the multilevel power substrate. The thermally-conductive die mount region is joined or bonded to the heat spreader region at a direct plated interface formed between the base substrate level and the secondary substrate level. Additionally, in at least some implementations, an electrically-routed interposer is further embedded in the base substrate level and containing the thermally-conductive die mount region, with the heat spreader region is contained in the secondary substrate level and plated directly onto the thermally-conductive die mount region. Additionally or alternatively, the electrically-routed interposer may assume the form of PCB interposer, while the thermally-conductive die mount region assumes the form of a metallic coin embedded in the PCB interposer.

Embodiments of an RF package have also been disclosed, with the RF package including a multilevel power substrate, an embedded heat dissipation structure, package terminals accessible from an exterior of the RF package, and an RF power die contained in the RF package. The multilevel power substrate includes, in turn, a base substrate level and a secondary substrate level, which is formed over and bonded to the base substrate level. A die support surface is defined by a first of the base substrate level and the secondary substrate level, while a backside surface is defined by a second of the base substrate level and the secondary substrate level. The backside surface located opposite the die support surface taken in a substrate thickness direction. Formed in the base substrate level and in the secondary substrate level, the embedded heat dissipation structure includes: (i) a heat spreader region exposed along the backside surface of the multilevel power substrate; and (ii) a thermally-conductive die mount region exposed along the die support surface of the multilevel power substrate, the thermally-conductive die mount region joined to the heat spreader region at a direct plated interface formed between the base substrate level and the secondary substrate level. The RF power die is mounted to the thermally-conductive die mount region and electrically coupled to the package terminals through the multilevel power substrate.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention. It being understood that various changes may be made in the function and arrangement of elements described in an example embodiment without departing from the scope of the invention as set forth in the appended claims.

What is claimed is:

1. A method for fabricating microelectronic packages, the method comprising:
    obtaining a base panel level containing prefabricated base structures and having a surface through which metallic surfaces of the prefabricated base structures are exposed, wherein the prefabricated base structures include a heat spreader region and a terminal block, wherein the heat spreader region and the terminal block extend through an entire thickness of the base panel level, and wherein the base panel level provides a panel-wide backside surface;
    forming a secondary panel level on the base panel level to produce a multilevel substrate panel comprised of a presingulated array of multilevel power substrates, the secondary panel level including patterned metal features embedded in a secondary dielectric body and electrically contacting the exposed metallic surfaces of the prefabricated base structures at a direct plated interface, wherein the patterned metal features include routing features connected to the terminal block and a thermally-conductive die mount region connected to the heat spreader region, wherein the secondary panel level provides a panel-wide die support surface opposite the panel-wide backside surface, and wherein the heat spreader region and the thermally-conductive die mount region together extend from the panel-wide backside surface to the panel-wide die support surface;
    attaching a first integrated circuit (IC) die to the thermally-conductive die mount region at the panel-wide die support surface;
    electrically interconnecting, with wirebonds, the first IC die with the routing features in the secondary panel level; and
    separating the presingulated array of multilevel power substrates into singulated multilevel power substrates each including a base substrate level formed from a singulated piece of the base panel level and a secondary substrate level formed from a singulated piece of the secondary substrate level.

2. The method of claim 1, further comprising attaching additional IC dies to the panel-wide die support surface and electrically interconnecting the additional IC dies with routing features contained in the multilevel substrate panel.

3. A method for fabricating multilevel power substrates incorporated into radio frequency (RF) packages, the method comprising:
    producing a multilevel substrate panel comprised of a presingulated array of multilevel power substrates, wherein producing the multilevel substrate panel includes
        obtaining a base panel level containing prefabricated base structures and having a surface through which metallic surfaces of the prefabricated base structures are exposed, wherein the prefabricated base structures comprise electrically-routed interposers embedded in the base panel level and containing thermally-conductive die mount regions, and
        forming a secondary panel level on the base panel level to complete the multilevel substrate panel, the secondary panel level including patterned metal features embedded in a secondary dielectric body and electrically contacting the exposed metallic surfaces of the prefabricated base structures at a direct plated interface,
    and wherein
        the multilevel substrate panel has a panel-wide die support surface and a panel-wide backside surface opposite the panel-wide die support surface, as taken in a substrate thickness direction,
        in conjunction with producing the multilevel substrate panel, heat dissipation structures are created in the base panel level and in the secondary panel level extending from the panel-wide die support surface to the panel-wide backside surface,
        the heat dissipation structures include thermally-conductive die mount regions and heat spreader regions formed in contact at the directed plated interface,
        the heat spreader regions are produced in conjunction with formation of the patterned metal features contained in the secondary panel level by directly plating the heat spreader regions onto the thermally-conductive die mount regions of the electrically-routed interposers, and
        the heat spreader regions are exposed along the panel-wide backside surface, while the thermally-conductive die mount regions are exposed along the panel-wide die support surface;
    attaching integrated circuit (IC) dies to the panel-wide die support surface;
    electrically interconnecting the IC dies with routing features contained in the multilevel substrate panel; and
    separating the presingulated array of multilevel power substrates into singulated multilevel power substrates each including a base substrate level formed from a singulated piece of the base panel level and a secondary substrate level formed from a singulated piece of the secondary substrate level.

4. The method of claim 3, further comprising selecting the electrically-routed interposers and the heat spreader regions to comprise printed circuit board (PCB) interposers and metallic coins embedded in the PCB interposers, respectively.

5. The method of claim 4, wherein the PCB interposers further comprise electrical routing features; and
   wherein the method further comprises forming the patterned metal features contained in the secondary panel level to further include terminal blocks plated onto the PCB interposers and in electrical contact with the electrical routing features, the terminal blocks exposed along the backside surface of the secondary substrate level.

6. A method for fabricating multilevel power substrates incorporated into radio frequency (RF) packages, the method comprising:
   producing a multilevel substrate panel comprised of a presingulated array of multilevel power substrates, wherein producing the multilevel substrate panel includes obtaining a base panel level containing prefabricated base structures and having a surface through which metallic surfaces of the prefabricated base structures are exposed, wherein the prefabricated base structures comprise leadframes joined as a leadframe array and including leadframe die pads, and
      forming a secondary panel level on the base panel level to complete the multilevel substrate panel, the secondary panel level including patterned metal features embedded in a secondary dielectric body and electrically contacting the exposed metallic surfaces of the prefabricated base structures at a direct plated interface,
   and wherein
      the multilevel substrate panel has a panel-wide die support surface and a panel-wide backside surface opposite the panel-wide die support surface, as taken in a substrate thickness direction,
      in conjunction with producing the multilevel substrate panel, heat dissipation structures are created in the base panel level and in the secondary panel level extending from the panel-wide die support surface to the panel-wide backside surface,
      the heat dissipation structures include thermally-conductive die mount regions and heat spreader regions formed in contact at the directed plated interface, and
      the heat spreader regions are exposed along the panel-wide backside surface, while the thermally-conductive die mount regions are exposed along the panel-wide die support surface;
   attaching integrated circuit (IC) dies to the panel-wide die support surface;
   electrically interconnecting the IC dies with routing features contained in the multilevel substrate panel; and
   separating the presingulated array of multilevel power substrates into singulated multilevel power substrates each including a base substrate level formed from a singulated piece of the base panel level and a secondary substrate level formed from a singulated piece of the secondary substrate level
   wherein the leadframe array is singulated in conjunction with separating the presingulated array of multilevel power substrates into singulated multilevel power substrates such that the singulated multilevel power substrates each contain at least one of the leadframe die pads forming the heat spreader regions of the heat dissipation structures.

7. The method of claim 6, further comprising:
   forming patterned metal features in the secondary panel level utilizing a plating process; and
   producing the patterned metal features to include metallic blocks plated directly onto the leadframe die pads to form the thermally-conductive die mount regions of the heat dissipation structures.

8. The method of claim 7, further comprising producing the patterned metal features to further include plated routing features embedded in the secondary panel level and electrically coupled to leadframe terminal blocks contained in the base panel level.

9. The method of claim 8, further comprising embedding microelectronic components in the secondary panel level electrically coupled to the plated routing features.

10. A method for fabricating multilevel power substrates incorporated into radio frequency (RF) packages, the method comprising:
   producing a multilevel substrate panel comprised of a presingulated array of multilevel power substrates, wherein producing the multilevel substrate panel includes
      obtaining a base panel level containing prefabricated base structures and having a surface through which metallic surfaces of the prefabricated base structures are exposed, and
      forming a secondary panel level on the base panel level to complete the multilevel substrate panel, the secondary panel level including patterned metal features embedded in a secondary dielectric body and electrically contacting the exposed metallic surfaces of the prefabricated base structures at a direct plated interface,
   and wherein
      the multilevel substrate panel has a panel-wide die support surface and a panel-wide backside surface opposite the panel-wide die support surface, as taken in a substrate thickness direction,
      in conjunction with producing the multilevel substrate panel, heat dissipation structures are created in the base panel level and in the secondary panel level extending from the panel-wide die support surface to the panel-wide backside surface,
      the heat dissipation structures include thermally-conductive die mount regions and heat spreader regions formed in contact at the directed plated interface,
      the heat spreader regions are exposed along the panel-wide backside surface, while the thermally-conductive die mount regions are exposed along the panel-wide die support surface, and
      the heat spreader regions have volumes greater than the thermally-conductive die mount regions and the heat spreader regions have widths greater than the thermally-conductive die mount regions, as measured along an axis perpendicular to the substrate thickness direction;
   attaching integrated circuit (IC) dies to the panel-wide die support surface;
   electrically interconnecting the IC dies with routing features contained in the multilevel substrate panel; and
   separating the presingulated array of multilevel power substrates into singulated multilevel power substrates each including a base substrate level formed from a singulated piece of the base panel level and a secondary substrate level formed from a singulated piece of the secondary substrate level.

11. A microelectronic package comprising:
a base substrate level that includes a heat spreader region and package terminals embedded in and extending through an entire thickness of a base dielectric body;
a secondary substrate level formed over and bonded to the base substrate level;
a thermally-conductive die mount region embedded in the secondary substrate level;
a die support surface defined by the secondary substrate level;
a backside surface defined by the base substrate level, the backside surface located opposite the die support surface taken in a substrate thickness direction;
an embedded heat dissipation structure formed in the base substrate level and in the secondary substrate level, the embedded heat dissipation structure comprising:
the heat spreader region exposed along the backside surface of the multilevel power substrate, and
the thermally-conductive die mount region exposed along the die support surface of the multilevel power substrate, the thermally-conductive die mount region joined to the heat spreader region at a direct plated interface formed between the base substrate level and the secondary substrate level; and
an integrated circuit die mounted to the thermally-conductive die mount region and electrically coupled to the package terminals through wirebonds and the secondary substrate level.

12. The microelectronic package of claim 11, wherein the heat spreader region comprises a leadframe die pad embedded in the base substrate level; and
wherein the thermally-conductive die mount region is contained in the secondary substrate level and plated directly onto the leadframe die pad.

13. The microelectronic package of claim 12, wherein:
the package terminals include leadframe terminal blocks embedded in the base substrate level and having surfaces exposed along the backside surface; and
the microelectronic package further includes plated routing features formed in the secondary substrate level, electrically coupled to the leadframe terminal blocks, and having surfaces exposed along the die support surface.

14. The microelectronic package of claim 13, further comprising a microelectronic component embedded in the secondary substrate level and electrically coupled to the plated routing features.

15. A microelectronic package comprising:
a base substrate level that includes an electrically-routed interposer embedded in the base substrate level and containing a thermally-conductive die mount region, wherein a die support surface is defined by the base substrate level;
a secondary substrate level formed over and bonded to the base substrate level, wherein the secondary substrate level includes a heat spreader region plated directly onto the thermally-conductive die mount region, and a terminal block spaced from and flanking the heat spreader region, wherein the heat spreader region and the terminal block extend through an entire thickness of the secondary substrate level, and wherein a backside surface is defined by the secondary substrate level, the backside surface located opposite the die support surface taken in a substrate thickness direction;
an embedded heat dissipation structure formed in the base substrate level and in the secondary substrate level, wherein the embedded heat dissipation structure includes
the heat spreader region exposed along the backside surface, and
the thermally-conductive die mount region exposed along the die support surface, the thermally-conductive die mount region joined to the heat spreader region at a direct plated interface formed between the base substrate level and the secondary substrate level; and
an integrated circuit die mounted to the thermally-conductive die mount region and electrically coupled to the terminal block through wirebonds and the base substrate level.

16. The microelectronic package of claim 15, wherein the electrically-routed interposer comprises a printed circuit board (PCB) interposer; and
wherein the thermally-conductive die mount region comprises a metallic coin embedded in the PCB interposer.

17. The microelectronic package of claim 16, wherein the PCB interposer further comprises electrical routing features; and
wherein the terminal block is plated onto the PCB interposer and in electrical contact with the electrical routing features, the terminal block exposed along the backside surface of the secondary substrate level.

18. A radio frequency (RF) package, comprising:
a multilevel power substrate, comprising:
a base substrate level;
a secondary substrate level formed over and bonded to the base substrate level;
a die support surface defined by a first of the base substrate level and the secondary substrate level;
a backside surface defined by a second of the base substrate level and the secondary substrate level, the backside surface located opposite the die support surface taken in a substrate thickness direction; and
an embedded heat dissipation structure formed in the base substrate level and in the secondary substrate level, the embedded heat dissipation structure comprising:
a heat spreader region exposed along the backside surface of the multilevel power substrate; and
a thermally-conductive die mount region exposed along the die support surface of the multilevel power substrate, the thermally-conductive die mount region joined to the heat spreader region at a direct plated interface formed between the base substrate level and the secondary substrate level;
package terminals accessible from an exterior of the RF package; and
a RF power die mounted to the thermally-conductive die mount region and electrically coupled to the package terminals through the multilevel power substrate.

19. The RF package of claim 18, wherein:
the thermally-conductive die mount region is formed from a portion of an electrically-routed interposer embedded in the first of the base substrate level and the secondary substrate level.

20. The RF package of claim 18, wherein:
the heat spreader region and the package terminals are formed from portions of a leadframe that is embedded in the second of the base substrate level and the secondary substrate level.

* * * * *